US007090337B2

(12) United States Patent
Silverbrook

(10) Patent No.: US 7,090,337 B2
(45) **Date of Patent: *Aug. 15, 2006**

(54) INKJET PRINTHEAD COMPRISING CONTRACTIBLE NOZZLE CHAMBERS

(75) Inventor: Kia Silverbrook, Balmain (AU)

(73) Assignee: Silverbrook Research Pty Ltd, Balmain (AU)

( * ) Notice: Subject to any disclaimer, the term of this patent is extended or adjusted under 35 U.S.C. 154(b) by 0 days.

This patent is subject to a terminal disclaimer.

(21) Appl. No.: 11/144,801

(22) Filed: Jun. 6, 2005

(65) Prior Publication Data

US 2005/0219322 A1 Oct. 6, 2005

Related U.S. Application Data

(63) Continuation of application No. 10/810,588, filed on Mar. 29, 2004, now Pat. No. 6,913,346, which is a continuation of application No. 09/798,714, filed on Mar. 2, 2001, now Pat. No. 6,712,453, which is a continuation-in-part of application No. 09/112,809, filed on Jul. 10, 1998, now Pat. No. 6,283,582.

(30) Foreign Application Priority Data

Jul. 15, 1997 (AU) .................................... PO7991
Jul. 15, 1997 (AU) .................................... PO8062

(51) Int. Cl.
*B41J 2/04* (2006.01)
*B41J 2/05* (2006.01)

(52) U.S. Cl. .......................................... 347/54; 347/65

(58) Field of Classification Search .................. 347/54, 347/56, 61, 65
See application file for complete search history.

(56) References Cited

U.S. PATENT DOCUMENTS 4,094,492 A 6/1978 Beeman et al.
4,728,392 A 3/1988 Miura et al.
5,072,241 A * 12/1991 Shibaike et al. .............. 347/54
5,278,585 A 1/1994 Karz et al.
5,513,431 A 5/1996 Ohno et al.
5,598,200 A 1/1997 Gore
5,719,604 A * 2/1998 Inui et al. ...................... 347/54
5,825,275 A * 10/1998 Wuttig et al. ............... 337/139
5,828,394 A 10/1998 Khuri-Yakub et al.
5,838,351 A 11/1998 Weber
5,872,582 A 2/1999 Pan
5,896,155 A 4/1999 Lebens et al.
5,970,998 A 10/1999 Talbot et al.
6,010,254 A 1/2000 Sanada et al.
6,174,050 B1 * 1/2001 Kashino et al. ............... 347/65

(Continued)

FOREIGN PATENT DOCUMENTS

JP 404001051 A 1/1992

OTHER PUBLICATIONS

Krause P et al "A micromachined single-chip inkjet printhead" Sensors and Actuators A53, 405-409-Jul. 1996.

*Primary Examiner*—An H. Do

(57) ABSTRACT

An inkjet printhead having a plurality of nozzle assemblies is provided. Each nozzle assembly comprises a nozzle chamber for ink to be ejected. The chamber includes an ink inlet for fluid communication with an ink reservoir and a nozzle through which ink from the chamber can be ejected. Each nozzle assembly also includes at least one thermal actuator for contracting the chamber, such that ink is ejected through the nozzle.

10 Claims, 35 Drawing Sheets

U.S. PATENT DOCUMENTS

| | | | | |
|---|---|---|---|---|
| 6,231,772 | B1 | 5/2001 | Silverbrook | |
| 6,273,544 | B1 | 8/2001 | Silverbrook | |
| 6,305,788 | B1 | 10/2001 | Silverbrook | |
| 6,416,167 | B1 | 7/2002 | Silverbrook | |
| 6,669,332 | B1 | 12/2003 | Silverbrook | |
| 6,913,346 | B1 * | 7/2005 | Silverbrook | 347/54 |

* cited by examiner

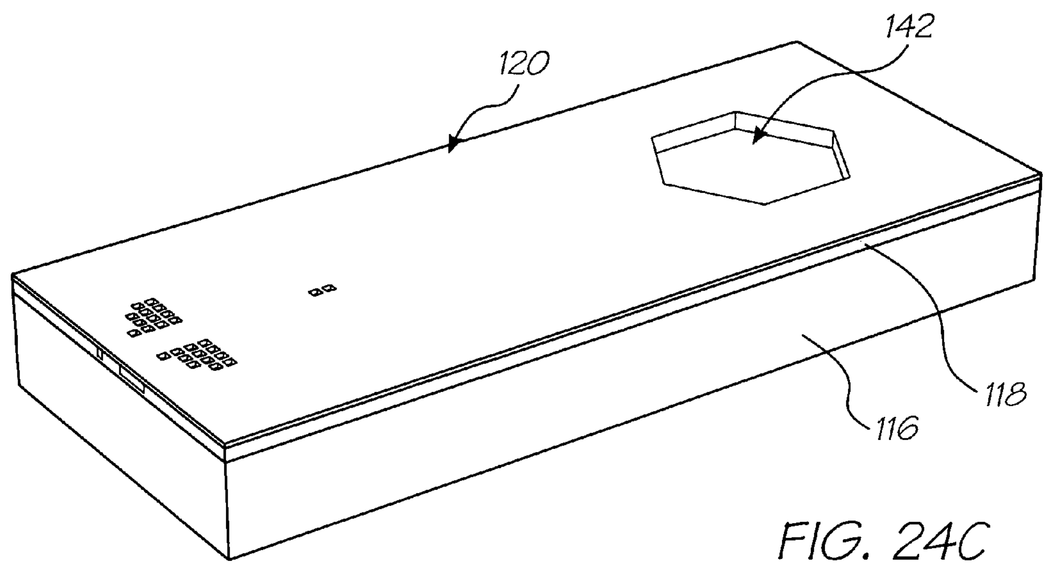
FIG. 24C
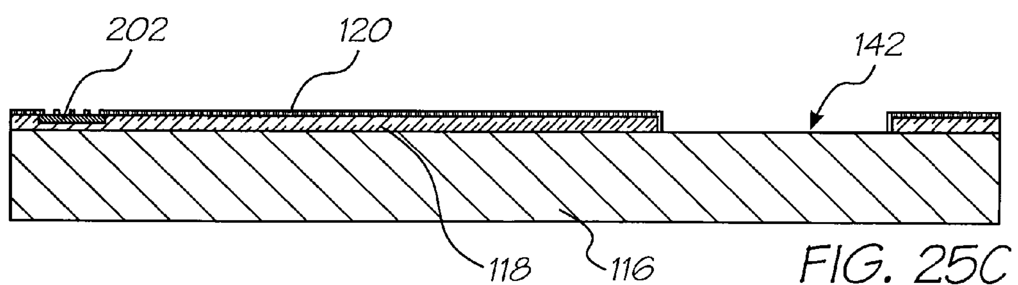
FIG. 25C
206
FIG. 26C

INKJET PRINTHEAD COMPRISING CONTRACTIBLE NOZZLE CHAMBERS

CROSS REFERENCE TO RELATED APPLICATION

The present application is a continuation of U.S. application Ser. No. 10/810,588 filed on Mar. 29, 2004, now U.S. Pat. No. 6,913,346, which is a continuation of U.S. application Ser. No. 09/798,714 filed on Mar. 2, 2001, now U.S. Pat. No. 6,712,453, which is a continuation-in-part of U.S. application Ser. No. 09/112,809 filed on Jul. 10, 1998, now U.S. Pat. No. 6,283,582, the entire contents of which is are herein incorporated by reference.

FIELD OF THE INVENTION

The present invention relates to ink jet printing and in particular discloses an iris motion ink jet printer.

The present invention further relates to the field of drop on demand ink jet printing.

BACKGROUND OF THE INVENTION

Many different types of printing have been invented, a large number of which are presently in use. The known forms of printing have a variety of methods for marking the print media with a relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques of ink jet printing have been invented. For a survey of the field, reference is made to an article by J Moore, "Non-Impact Printing: Introduction and Historical Perspective", Output Hard Copy Devices, Editors R Dubeck and S Sherr, pages 207–220 (1988).

Ink Jet printers themselves come in many different forms. The utilization of a continuous stream of ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of a continuous ink jet printing including the step wherein the ink jet stream is modulated by a high frequency electro-static field so as to cause drop separation. This technique is still utilized by several manufacturers including Elmjet and Scitex (see also U.S. Pat. No. 3,373,437 by Sweet et al)

Piezoelectric ink jet printers are also one form of commonly utilized ink jet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, Stemme in U.S. Pat. No. 3,747,120 (1972) discloses a bend mode of piezoelectric operation, Howkins in U.S. Pat. No. 4,459,601 discloses a piezoelectric push mode actuation of the ink jet stream and Fischbeck in U.S. Pat. No. 4,584,590 which discloses a shear mode type of piezoelectric transducer element.

Recently, thermal ink jet printing has become an extremely popular form of ink jet printing. The ink jet printing techniques include those disclosed by Endo et al in GB 2007162 (1979) and Vaught et al in U.S. Pat. No. 4,490,728. Both the aforementioned references disclosed ink jet printing techniques which rely upon the activation of an electrothermal actuator which results in the creation of a bubble in a constricted space, such as a nozzle, which thereby causes the ejection of ink from an aperture connected to the confined space onto a relevant print media. Printing devices utilizing the electro-thermal actuator are manufactured by manufacturers such as Canon and Hewlett Packard.

As can be seen from the foregoing, many different types of printing technologies are available. Ideally, a printing technology should have a number of desirable attributes. These include inexpensive construction and operation, high speed operation, safe and continuous long term operation etc. Each technology may have its own advantages and disadvantages in the areas of cost, speed, quality, reliability, power usage, simplicity of construction operation, durability and consumables.

SUMMARY OF THE INVENTION

According to one aspect, the present invention provides an inkjet nozzle assembly comprising:

a nozzle chamber for ink to be ejected, the chamber comprising an ink inlet for fluid communication with an ink reservoir and a nozzle through which ink from the chamber can be ejected; and, at least one thermal actuator for contracting the chamber such that ink is ejected through the nozzle.

According to a second aspect, the present invention provides an ink nozzle assembly for an inkjet printer, the nozzle assembly comprising:

a nozzle and an actuator for ejecting ink through said nozzle; wherein, the actuator comprises a resiliently contractible chamber.

According to another aspect, the present invention provides an ink nozzle assembly for an inkjet printer, the nozzle assembly comprising:

a nozzle;

a nozzle chamber for ink to be ejected through the nozzle, the chamber comprising walls configured to define a first volume within the chamber; and, at least one actuator for reconfiguring the walls to define a second volume less than the first volume.

There is also disclosed herein an ink jet nozzle assembly including a nozzle chamber formed on a substrate, the nozzle chamber having an ink ejection port and a projecting rim formed integrally with the nozzle chamber about said ink ejection port.

There is further disclosed herein an ink jet nozzle assembly including:

a nozzle chamber having an inlet in fluid communication with an ink reservoir and a nozzle through which ink from the chamber can be ejected;

the chamber including a fixed portion and a movable portion configured for relative movement in an ejection phase and alternate relative movement in a refill phase;

an expanding, flexible arm and a rigid arm each connected with the movable portion and cooperating to effect periodically said relative movement; and the inlet being positioned and dimensioned relative to the nozzle such that ink is ejected preferentially from the chamber through the nozzle in droplet form during the ejection phase, and ink is alternately drawn preferentially into the chamber from the reservoir through the inlet during the refill phase.

Preferably the movable portion includes the nozzle and the fixed portion is mounted substrate.

Preferably the fixed portion includes the nozzle mounted on a substrate and the movable portion includes a vane unit.

Preferably a plurality of said vane units arranged around said ink ejection port, said vane units each attached to a said expanding, flexible arm and a said rigid arm such that upon activation, a volume of ink in the nozzle chamber adjacent said ejection port is pressurized so as to cause the ejection of ink from said ink ejection port.

Preferably said flexible arms comprise a conductive heater material encased within an expansion material having a high coefficient of thermal expansion.

Preferably said conductive heater material is constructed so as to form a concertina upon expansion of said expansion material.

Preferably said heater material is of a serpentine form and forms a concertina upon heating so as to allow substantially unhindered expansion of said expansion material during heating.

Preferably said vane units are arranged annularly around said ink ejection port.

Preferably said vane units operate as an iris around said ink ejection port.

Preferably the vane units are of a semi-circular form.

Preferably the assembly comprises four said vane units.

Preferably said expansion material comprises substantially polytetrafluoroethylene.

Preferably said conductive heater material comprises substantially copper.

Preferably an outer surface of said chamber includes a plurality of etchant holes provided so as to allow a rapid etching of sacrificial layers during construction.

BRIEF DESCRIPTION OF THE DRAWINGS

Notwithstanding any other forms which may fall within the scope of the present invention, preferred forms of the invention will now be described, by way of example only, with reference to the accompanying drawings in which.

FIGS. *24a* to *24r* show three-dimensional views of steps in the manufacture of a nozzle assembly of an ink jet printhead;

FIGS. *25a* to *25r* show sectional side views of the manufacturing steps;

FIGS. *26a* to *26k* show layouts of masks used in various steps in the manufacturing process;

FIGS. *27a* to *27c* show three dimensional views of an operation of the nozzle assembly manufactured according to the method of FIGS. 24 and 25; and FIGS. *28a* to *28c* show sectional side views of an operation of the nozzle assembly manufactured according to the method of FIGS. 24 and 25.

DESCRIPTION OF PREFERRED AND OTHER EMBODIMENTS

In the preferred embodiment, there is a provided an ink jet printhead which includes a series of nozzle arrangements, each nozzle arrangement including an actuator device comprising a plurality of actuators which actuate a series of paddles that operate in an iris type motion so as to cause the ejection of ink from a nozzle chamber.

Figure 1:
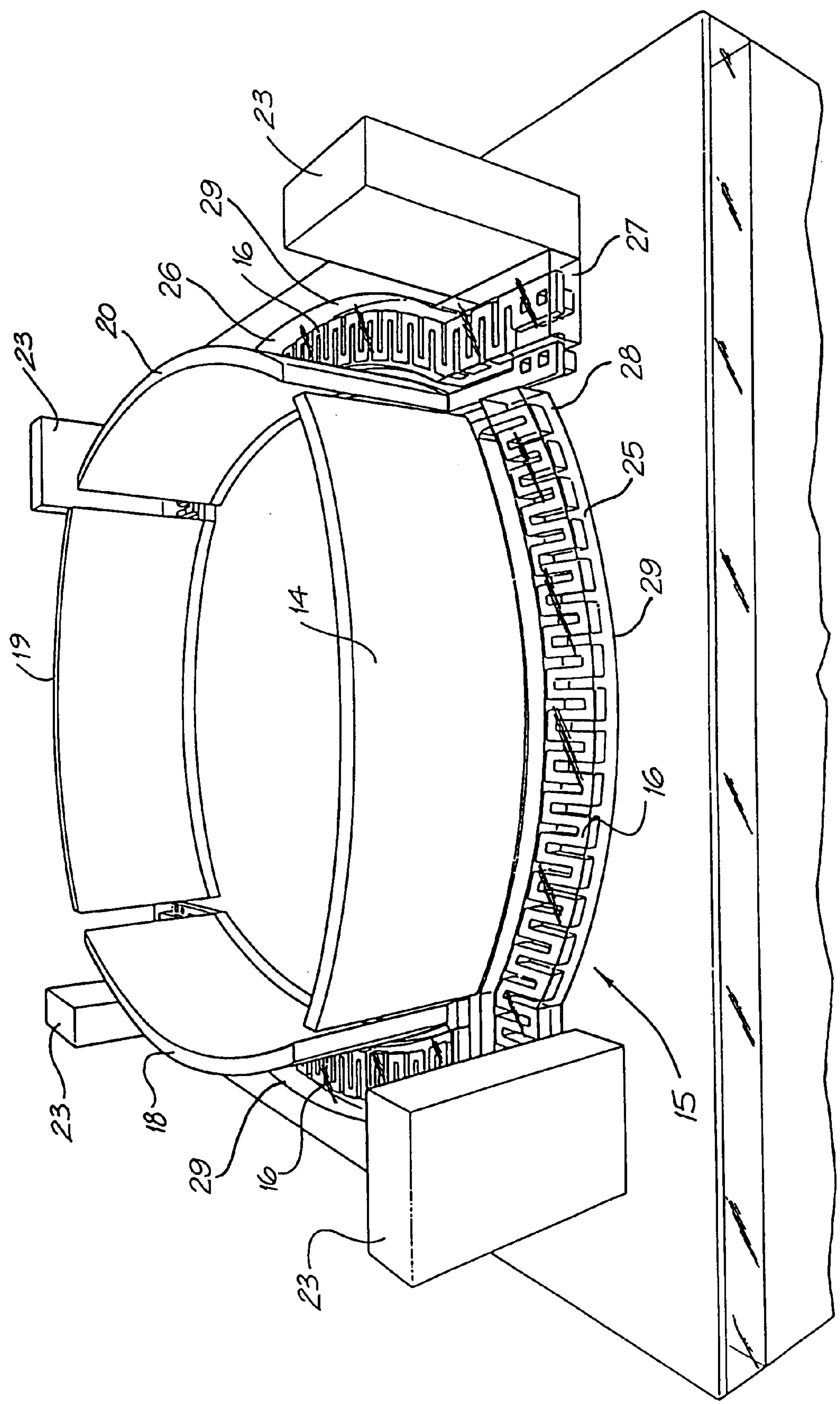
FIG. 1 is a perspective view of the actuator portions of a single ink jet nozzle in a quiescent position, constructed in accordance with the preferred embodiment.
Figure 2:
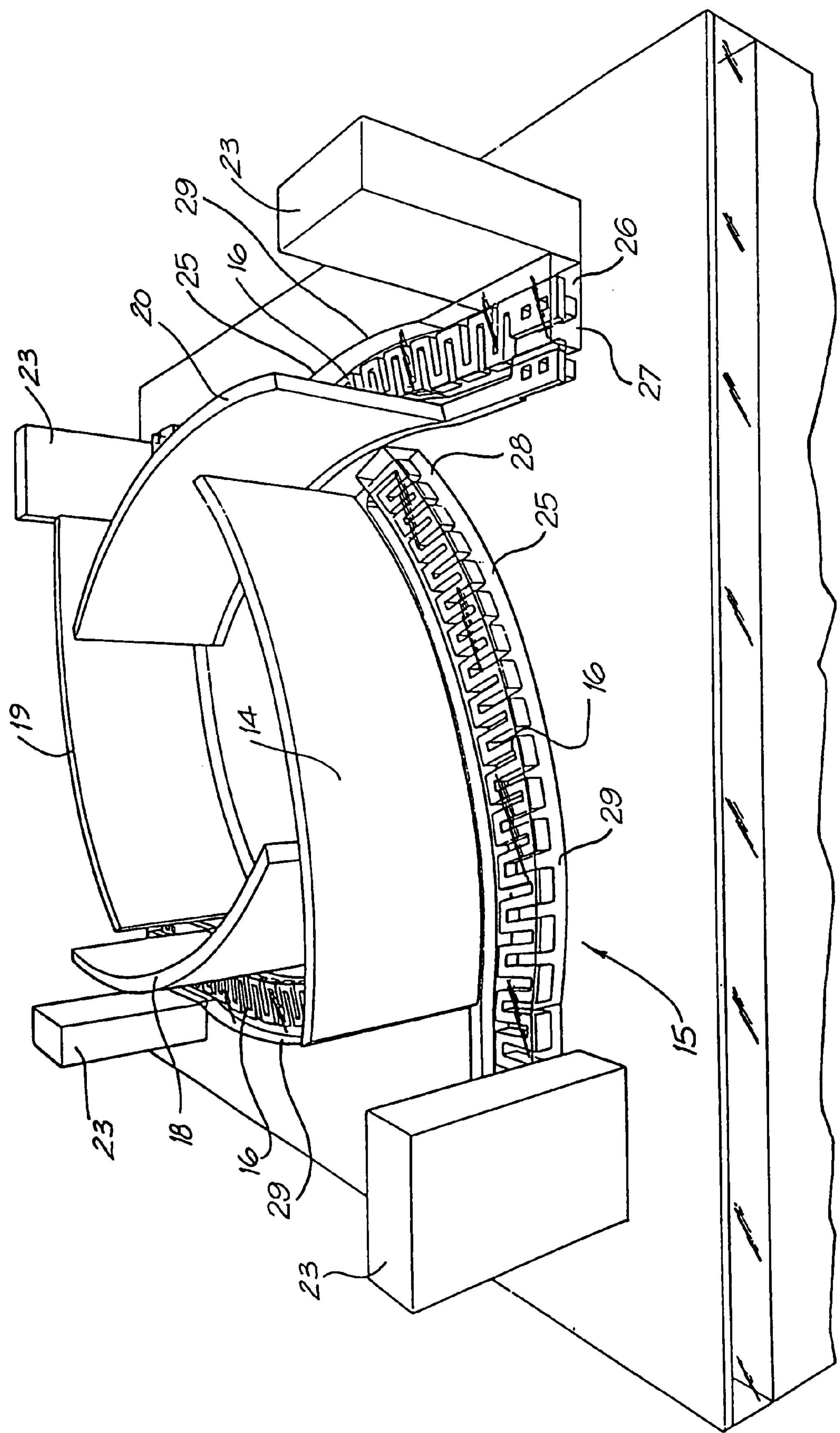
FIG. 2 is a perspective view of the actuator portions of a single ink jet nozzle in a quiescent position constructed in accordance with the preferred embodiment.
Figure 3:
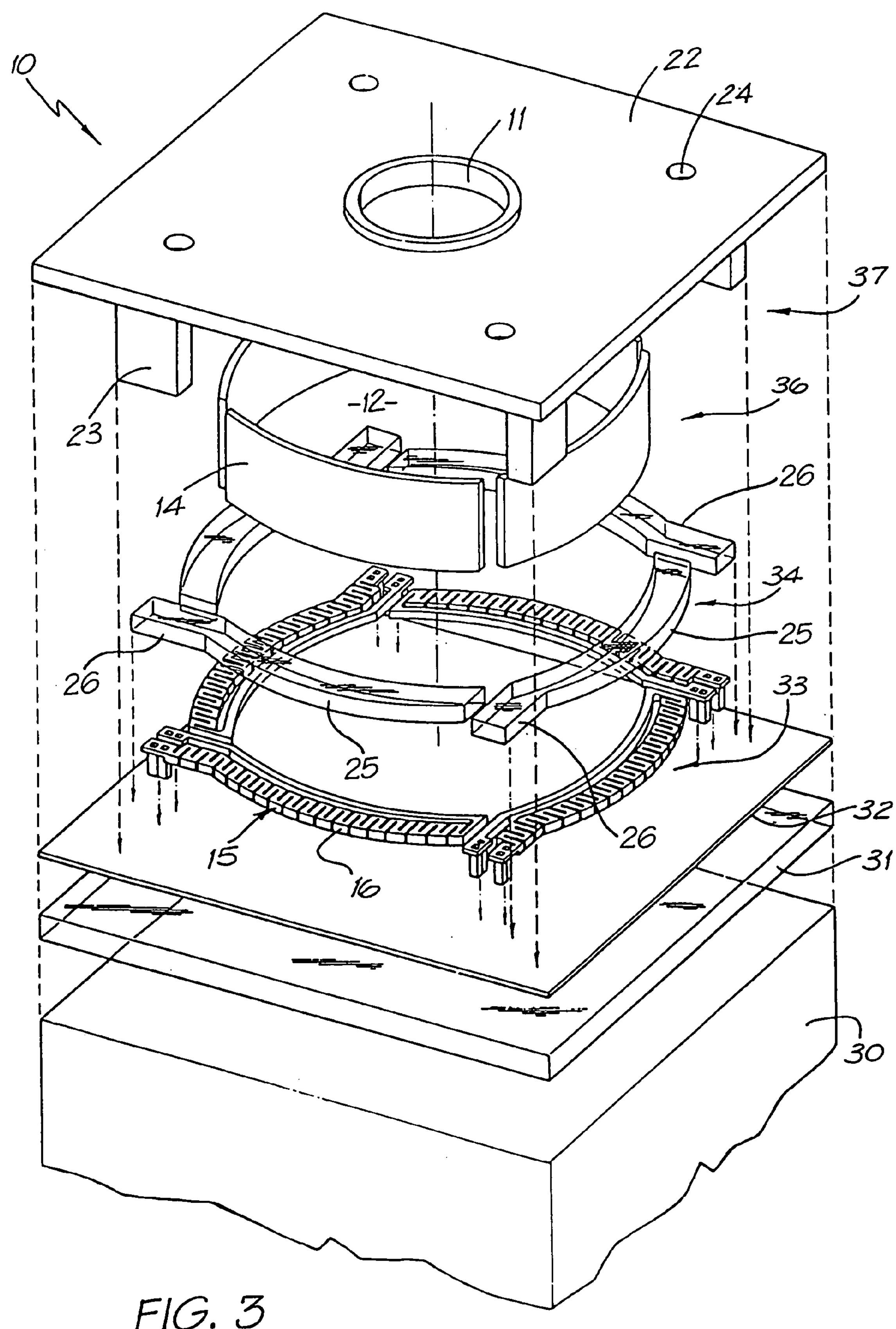
FIG. 3 is an exploded perspective view illustrating the construction of a single ink jet nozzle in accordance with the preferred embodiment.

Turning initially to FIG. 1 to FIG. 3, there is illustrated a single nozzle arrangement 10 (FIG. 3) for the ejection of ink from an ink ejection port 11. The ink is ejected out of the port 11 from a nozzle chamber 12 which is formed from 4 substantially identical iris vanes 14. Each iris vane 14 is operated simultaneously to cause the ink within the nozzle chamber 12 to be squeezed out of the nozzle chamber 12, thereby ejecting the ink from the ink ejection port 11.

Each nozzle vane 14 is actuated by means of a thermal actuator 15 positioned at its base. Each thermal actuator 15 has two arms namely, an expanding, flexible arm 25 and a rigid arm 26. Each actuator is fixed at one end 27 and is displaceable at an opposed end 28. Each expanding arm 25 can be constructed from a polytetrafluoroethylene (PTFE) layer 29, inside of which is constructed a serpentine copper heater 16. The rigid arm 26 of the thermal actuator 15 comprises return trays of the copper heater 16 and the vane 14. The result of the heating of the expandable arms 25 of the thermal actuators 15 is that the outer PTFE layer 29 of each actuator 15 is caused to bend around thereby causing the vanes 14 to push ink towards the centre of the nozzle chamber 12. The serpentine trays of the copper layer 16 concertina in response to the high thermal expansion of the PTFE layer 29. The other vanes 18–20 are operated simultaneously. The four vanes therefore cause a general compression of the ink within the nozzle chamber 12 resulting in a subsequent ejection of ink from the ink ejection port 11.

A roof 22 of the nozzle arrangement 10 is formed from a nitride layer and is supported by posts 23. The roof 22 includes a series of holes 24 which are provided in order to facilitate rapid etching of sacrificial materials within lower layers during construction. The holes 24 are provided of a small diameter such that surface tension effects are sufficient to stop any ink being ejected from the nitride holes 24 as opposed to the ink ejection port 11 upon activation of the iris vanes 14.

The arrangement of FIG. 1 can be constructed on a silicon wafer utilizing standard semi-conductor fabrication and micro-electro-mechanical systems (MEMS) techniques. For a general introduction to a micro-electro mechanical system (MEMS) reference is made to standard proceedings in this field including the proceedings of the SPIE (International Society for Optical Engineering), volumes 2642 and 2882 which contain the proceedings for recent advances and conferences in this field. The nozzle arrangement 10 can be constructed on a silicon wafer and built up by utilizing various sacrificial materials where necessary as is common practice with MEMS constructions. Turning to FIG. 3, there is illustrated an exploded perspective view of a single nozzle arrangement 10 illustrating the various layers utilized in the construction of a single nozzle. The lowest layer of the construction comprises a silicon wafer base 30. A large number of printheads each having a large number of print nozzles in accordance with requirements can be constructed on a single large wafer which is appropriately diced into separate printheads in accordance with requirements. On top of the silicon wafer layer 30 is first constructed a CMOS circuitry/glass layer 31 which provides all the necessary interconnections and driving control circuitry for the various heater circuits. On top of the CMOS layer 31 is constructed a nitride passivation layer 32 which is provided for passivating the lower CMOS layer 31 against any etchants which may be utilized. A layer 32 having the appropriate vias (not shown) for connection of the heater 16 to the relevant portion of the lower CMOS layer 31 is provided.

On top of the nitride layer 32 is constructed the aluminium layer 33 which includes various heater circuits in addition to vias to the lower CMOS layer.

Next a PTFE layer 34 is provided with the PTFE layer 34 comprising 2 layers which encase a lower copper layer 33. Next, a first nitride layer 36 is constructed for the iris vanes 14, 18–20 of FIG. 1. On top of this is a second nitride layer 37 which forms the posts and nozzle roof of the nozzle chamber 12.

The various layers 33, 34, 36 and 37 can be constructed utilizing intermediate sacrificial layers which are, as standard with MEMS processes, subsequently etched away so as to release the functional device. Suitable sacrificial materials include glass. When necessary, such as in the construction of nitride layer 37, various other semi-conductor processes such as dual damascene processing can be utilized.

Figure 4:
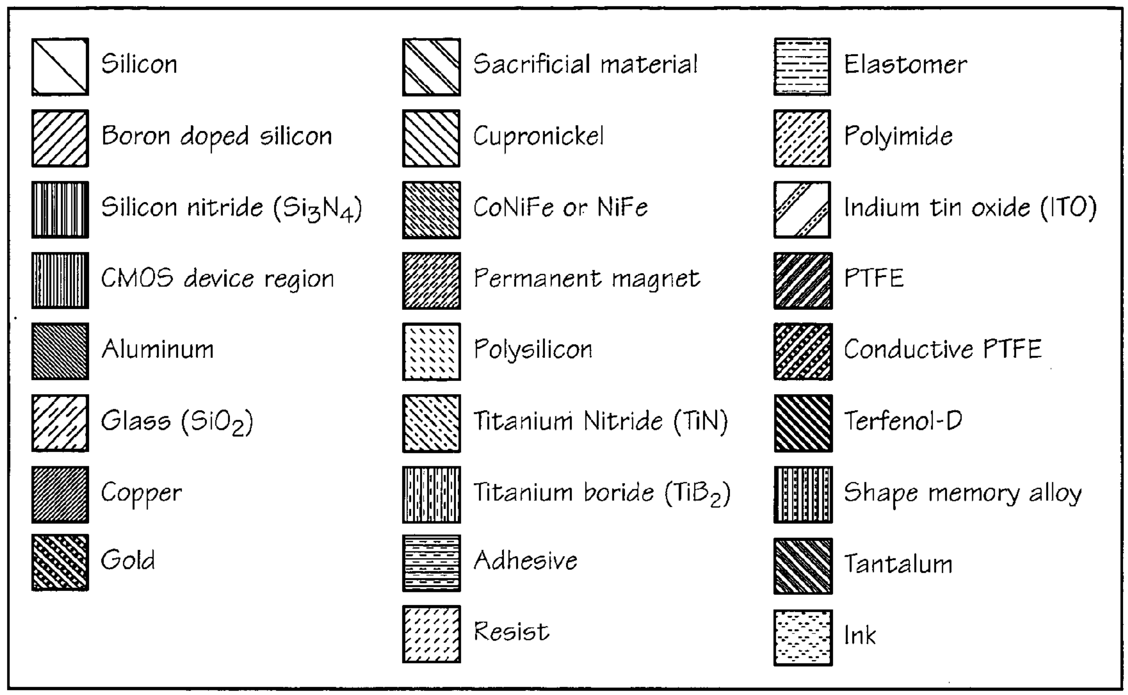
FIG. 4 provides a legend of the materials indicated in FIG. 5 to 16.
Figure 5:
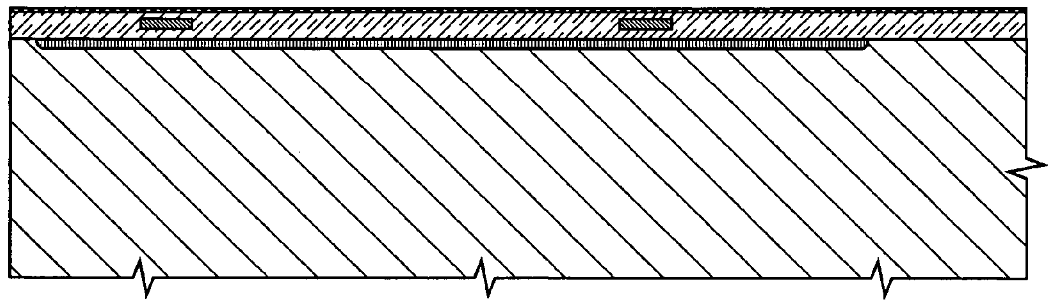
FIG. 5 to FIG. 16 illustrate sectional views of the manufacturing steps in one form of construction of an ink jet printhead nozzle.

One form of detailed manufacturing process which can be used to fabricate monolithic ink jet printheads operating in accordance with the principles taught by the present embodiment can proceed utilizing the following steps:

1. Using a double sided polished wafer, complete drive transistors, data distribution, and timing circuits using a 0.5 micron, one poly, 2 metal CMOS process. The wafer is passivated with 0.1 microns of silicon nitride. Relevant features of the wafer at this step are shown in FIG. 5. For clarity, these diagrams may not be to scale, and may not represent a cross section though any single plane of the nozzle. FIG. 4 is a key to representations of various materials in these manufacturing diagrams, and those of other cross referenced ink jet configurations.

2. Deposit 1 micron of sacrificial material (e.g. aluminum or photosensitive polyimide)

Figure 6:
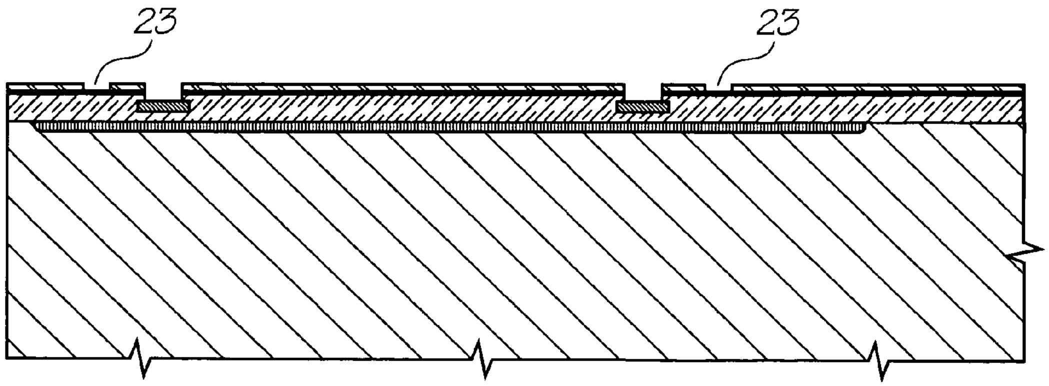

3. Etch the sacrificial layer using Mask 1. This mask defines the nozzle chamber posts 23 and the actuator anchor point. This step is shown in FIG. 6.

4. Deposit 1 micron of PTFE.

Figure 7:
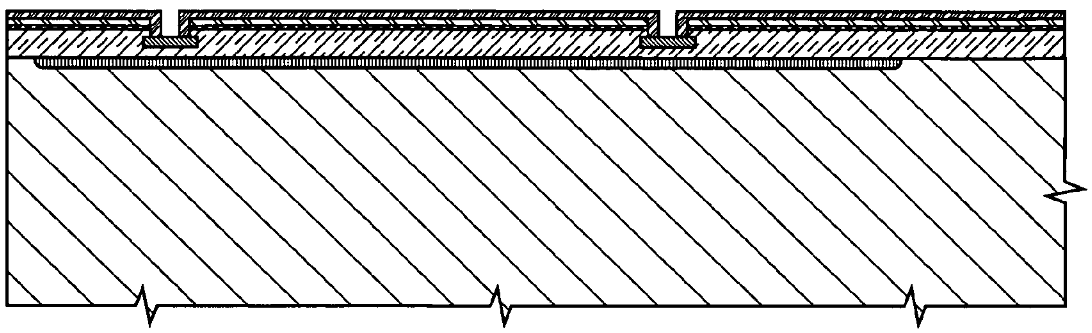

5. Etch the PTFE, nitride, and oxide down to second level metal using Mask 2. This mask defines the heater vias. This step is shown in FIG. 7.

6. Deposit 1 micron of a conductor with a low Young's modulus, for example aluminum or gold.

Figure 8:
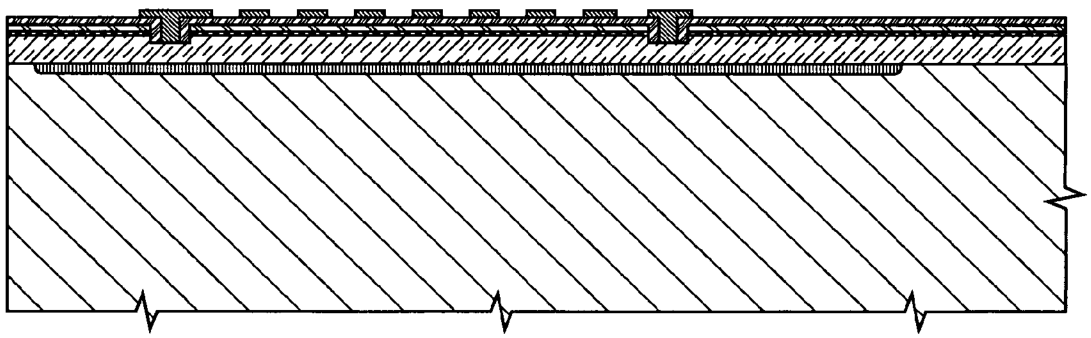

7. Pattern the conductor using Mask 3. This step is shown in FIG. 8.

8. Deposit 1 micron of PTFE.

Figure 9:
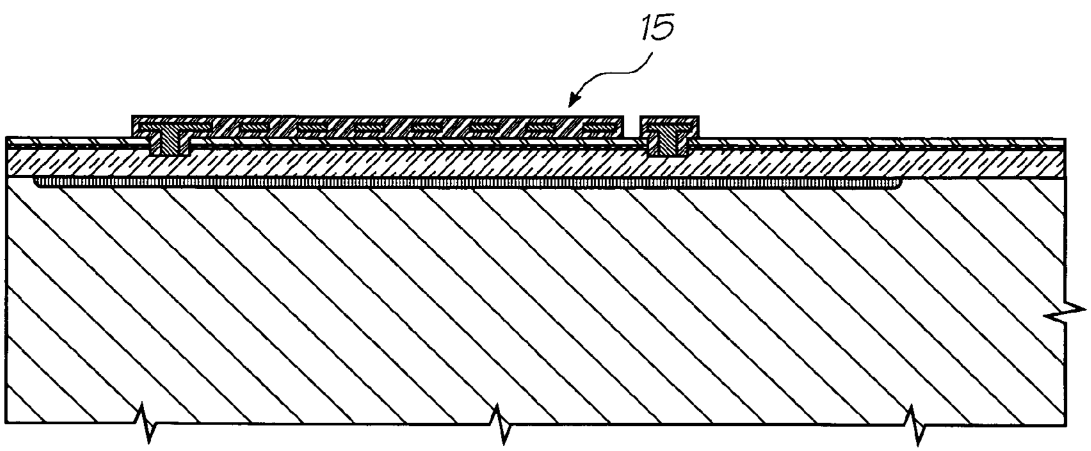

9. Etch the PTFE down to the sacrificial layer using Mask 4. This mask defines the actuators 15. This step is shown in FIG. 9.

10. Wafer probe. All electrical connections are complete at this point, bond pads are accessible, and the chips are not yet separated.

11. Deposit 6 microns of sacrificial material.

Figure 10:
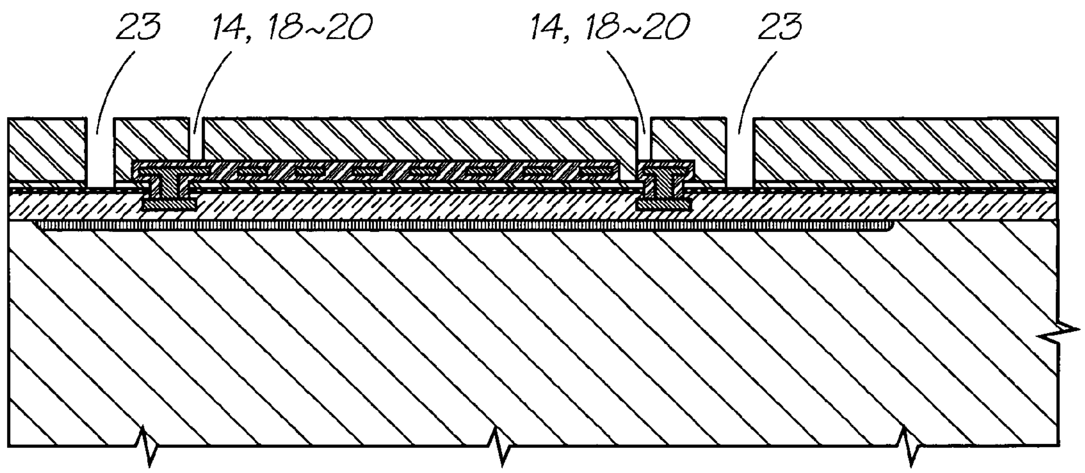

12. Etch the sacrificial material using Mask 5. This mask defines the iris paddle vanes 14, 18–20 and the nozzle chamber posts 23. This step is shown in FIG. 10.

13. Deposit 3 microns of PECVD glass and planarize down to the sacrificial layer using CMP.

14. Deposit 0.5 micron of sacrificial material.

Figure 11:
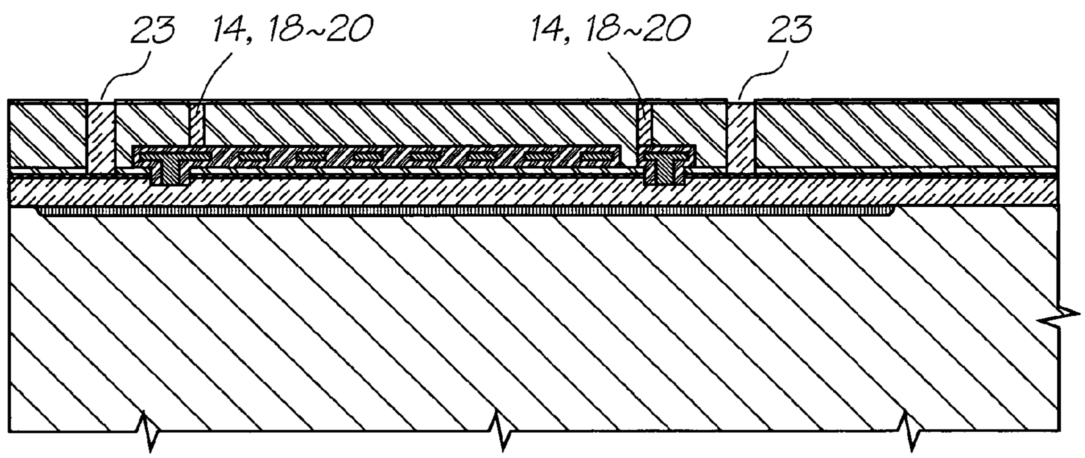

15. Etch the sacrificial material down to glass using Mask 6. This mask defines the nozzle chamber posts 23. This step is shown in FIG. 11.

16. Deposit 3 microns of PECVD glass.

Figure 12:
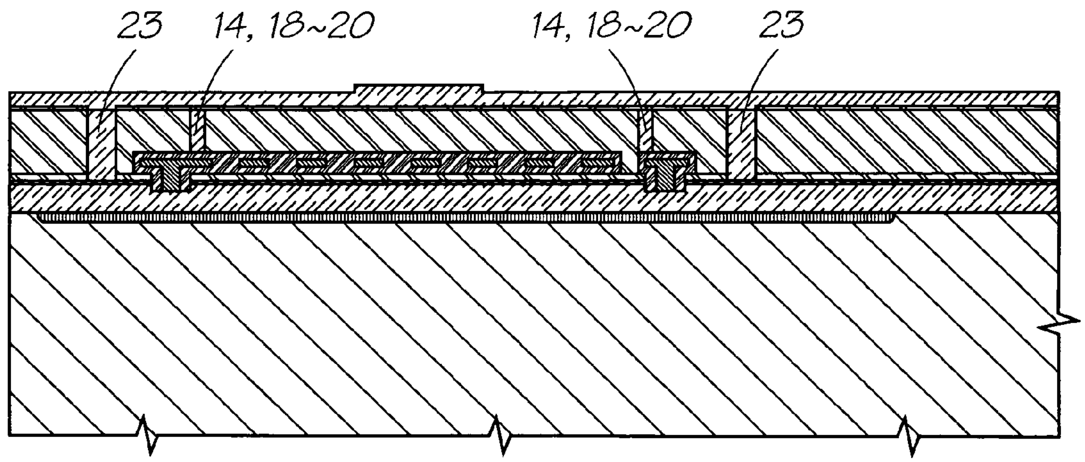

17. Etch to a depth of (approx.) 1 micron using Mask 7. This mask defines a nozzle rim. This step is shown in FIG. 12.

Figure 13:
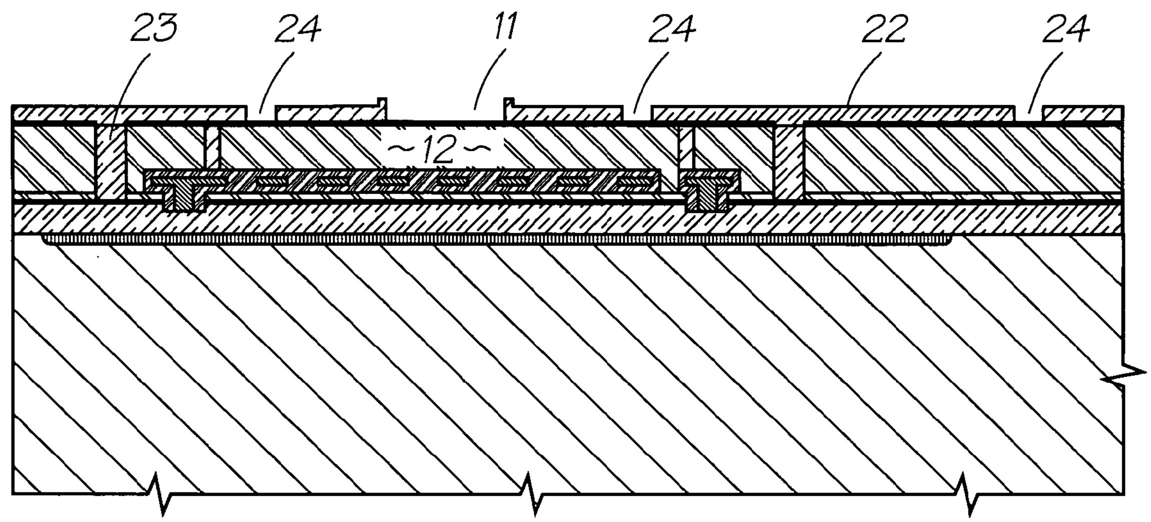

18. Etch down to the sacrificial layer using Mask 8. This mask defines the roof 22 of the nozzle chamber 12, the port 11, and the sacrificial etch access holes 24. This step is shown in FIG. 13.

Figure 14:
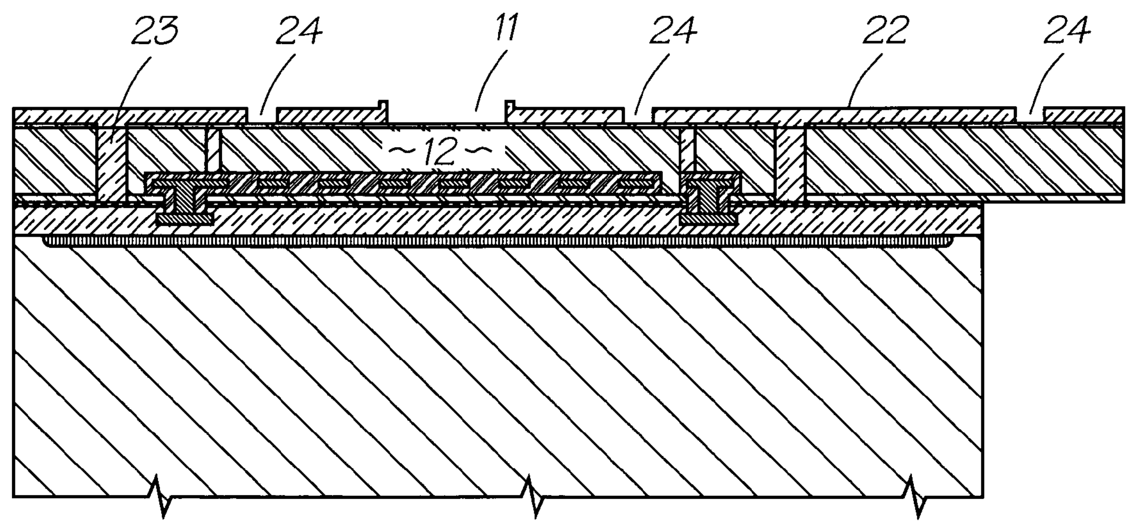

19. Back-etch completely through the silicon wafer (with, for example, an ASE Advanced Silicon Etcher from Surface Technology Systems) using Mask 9. This mask defines the ink inlets which are etched through the wafer. When the silicon layer is etched, change the etch chemistry to etch the glass and nitride using the silicon as a mask. The wafer is also diced by this etch. This step is shown in FIG. 14.

Figure 15:
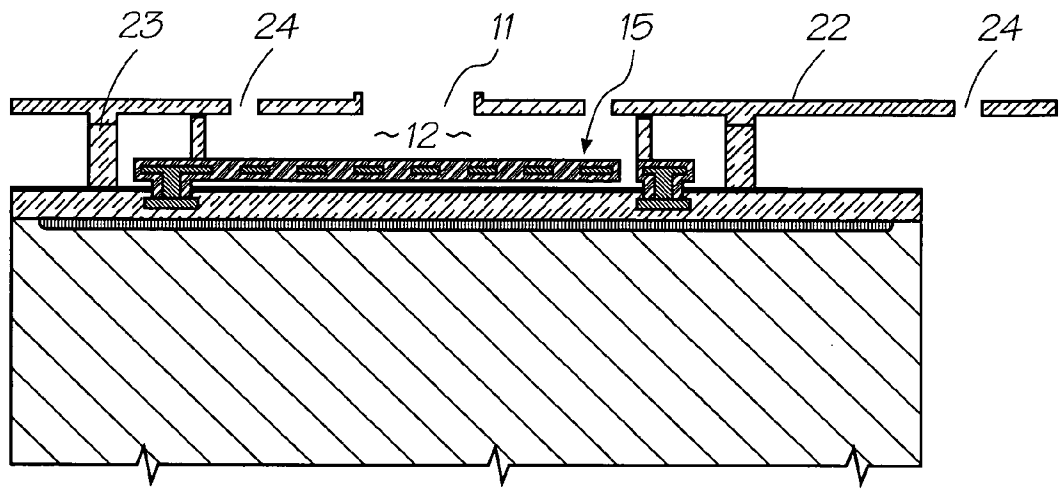

20. Etch the sacrificial material. The nozzle chambers 12 are cleared, the actuators 15 freed, and the chips are separated by this etch. This step is shown in FIG. 15.

21. Mount the printheads in their packaging, which may be a molded plastic former incorporating ink channels which supply the appropriate color ink to the ink inlets at the back of the wafer.

22. Connect the printheads to their interconnect systems. For a low profile connection with minimum disruption of airflow, TAB may be used. Wire bonding may also be used if the printer is to be operated with sufficient clearance to the paper.

23. Hydrophobize the front surface of the printheads.

Figure 16:
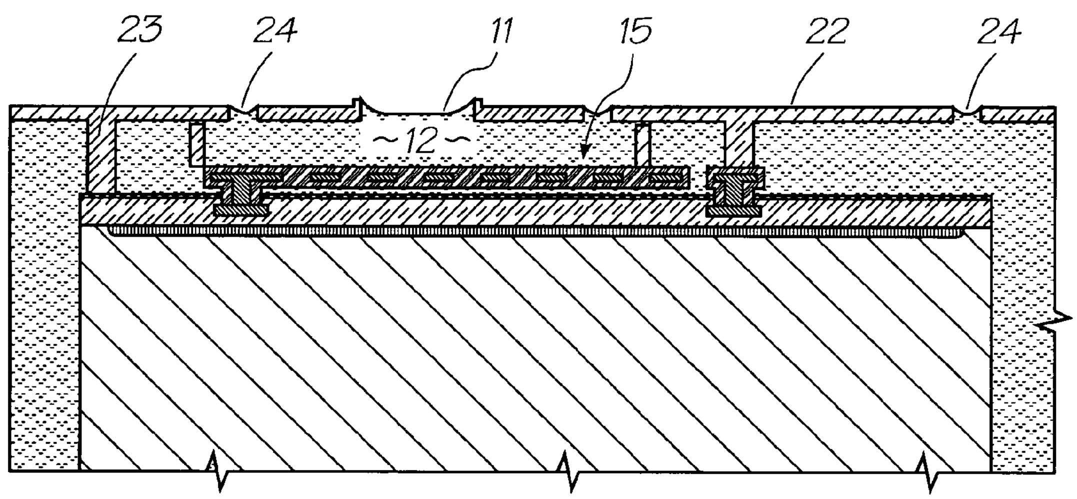

24. Fill the completed printheads with ink and test them. A filled nozzle is shown in FIG. 16.

Figure 17:
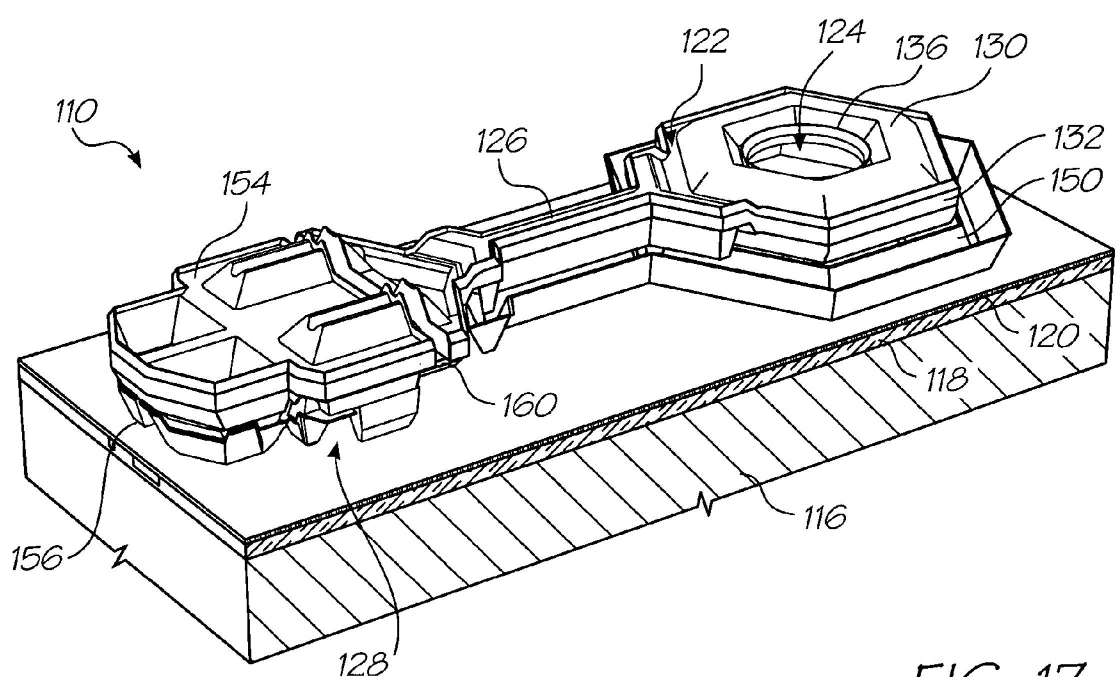
FIG. 17 shows a three dimensional, schematic view of a nozzle assembly for an ink jet printhead in accordance with the invention.

Referring now to FIG. 17 of the drawings, a nozzle assembly, in accordance with a further embodiment of the invention is designated generally by the reference numeral 110. An ink jet printhead has a plurality of nozzle assemblies 110 arranged in an array 114 (FIGS. 21 and 22) on a silicon substrate 116. The array 114 will be described in greater detail below.

The assembly 110 includes a silicon substrate or wafer 116 on which a dielectric layer 118 is deposited. A CMOS passivation layer 120 is deposited on the dielectric layer 118.

Each nozzle assembly 110 includes a nozzle 122 defining a nozzle opening 124, a connecting member in the form of a lever arm 126 and an actuator 128. The lever arm 126 connects the actuator 128 to the nozzle 122.

Figure 18:
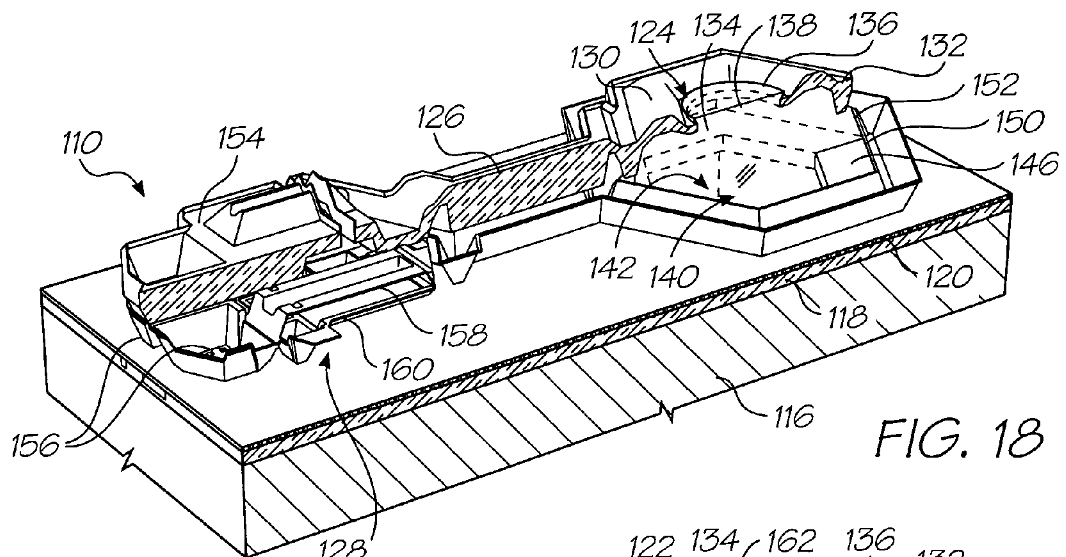
FIGS. 18 to 20 show a three dimensional, schematic illustration of an operation of the nozzle assembly of FIG. 17.
Figure 19:
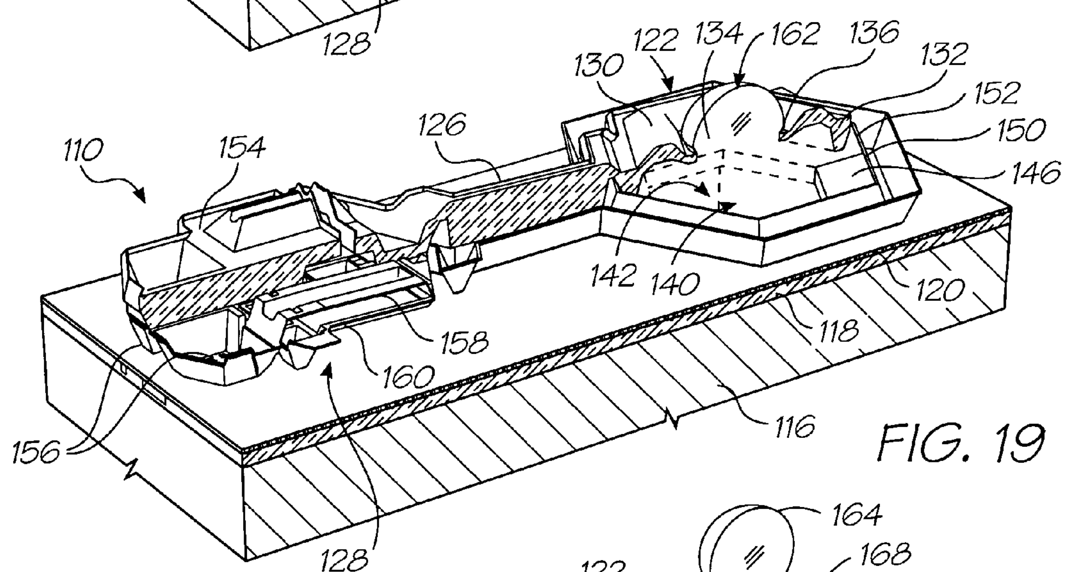
Figure 20:
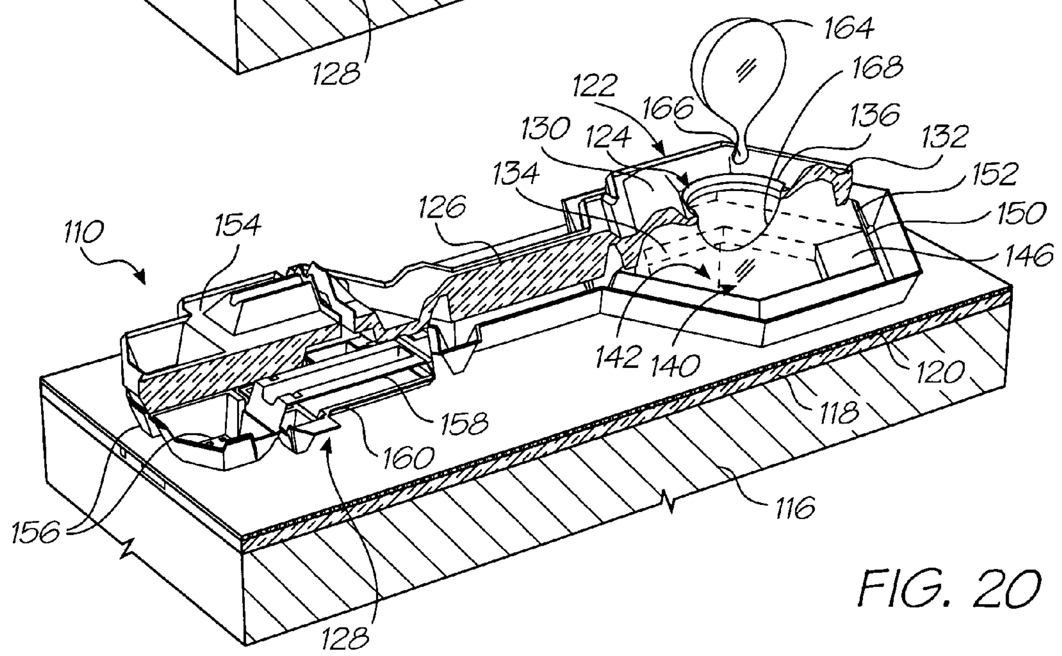

As shown in greater detail in FIG. 18 to 20 of the drawings, the nozzle 122 comprises a crown portion 130 with a skirt portion 132 depending from the crown portion 130. The skirt portion 132 forms part of a peripheral wall of a nozzle chamber 134 (FIG. 18 to 20 of the drawings). The nozzle opening 124 is in fluid communication with the nozzle chamber 134. It is to be noted that the nozzle opening 124 is surrounded by a raised rim 136 which "pins" a meniscus 138 (FIG. 18) of a body of ink 140 in the nozzle chamber 134.

An ink inlet aperture 142 (shown most clearly in FIG. 22) is defined in a floor 146 of the nozzle chamber 134. The aperture 142 is in fluid communication with an ink inlet channel 148 defined through the substrate 116.

A wall portion 150 bounds the aperture 142 and extends upwardly from the floor portion 146. The skirt portion 132, as indicated above, of the nozzle 122 defines a first part of a peripheral wall of the nozzle chamber 134 and the wall portion 150 defines a second part of the peripheral wall of the nozzle chamber 134.

The wall 150 has an inwardly directed lip 152 at its free end which serves as a fluidic seal which inhibits the escape of ink when the nozzle 122 is displaced, as will be described in greater detail below. It will be appreciated that, due to the viscosity of the ink 140 and the small dimensions of the spacing between the lip 152 and the skirt portion 132, the inwardly directed lip 152 and surface tension function as a seal for inhibiting the escape of ink from the nozzle chamber 134.

The actuator 128 is a thermal bend actuator and is connected to an anchor 154 extending upwardly from the substrate 116 or, more particularly, from the CMOS passivation layer 120. The anchor 154 is mounted on conductive pads 156 which form an electrical connection with the actuator 128.

The actuator 128 comprises a first, active beam 158 arranged above a second, passive beam 160. In a preferred embodiment, both beams 158 and 160 are of, or include, a conductive ceramic material such as titanium nitride (TiN).

Both beams 158 and 160 have their first ends anchored to the anchor 154 and their opposed ends connected to the arm 126. When a current is caused to flow through the active beam 158 thermal expansion of the beam 158 results. As the passive beam 160, through which there is no current flow, does not expand at the same rate, a bending moment is created causing the arm 126 and, hence, the nozzle 122 to be displaced downwardly towards the substrate 116 as shown in FIG. 19 of the drawings. This causes an ejection of ink through the nozzle opening 124 as shown at 162 in FIG. 19 of the drawings. When the source of heat is removed from the active beam 158, i.e. by stopping current flow, the nozzle 122 returns to its quiescent position as shown in FIG. 20 of the drawings. When the nozzle 122 returns to its quiescent position, an ink droplet 164 is formed as a result of the breaking of an ink droplet neck as illustrated at 166 in FIG. 20 of the drawings. The ink droplet 164 then travels on to the print media such as a sheet of paper. As a result of the formation of the ink droplet 164, a "negative" meniscus is formed as shown at 168 in FIG. 20 of the drawings. This "negative" meniscus 168 results in an inflow of ink 140 into the nozzle chamber 134 such that a new meniscus 138 (FIG. 18) is formed in readiness for the next ink drop ejection from the nozzle assembly 110.

Figure 21:
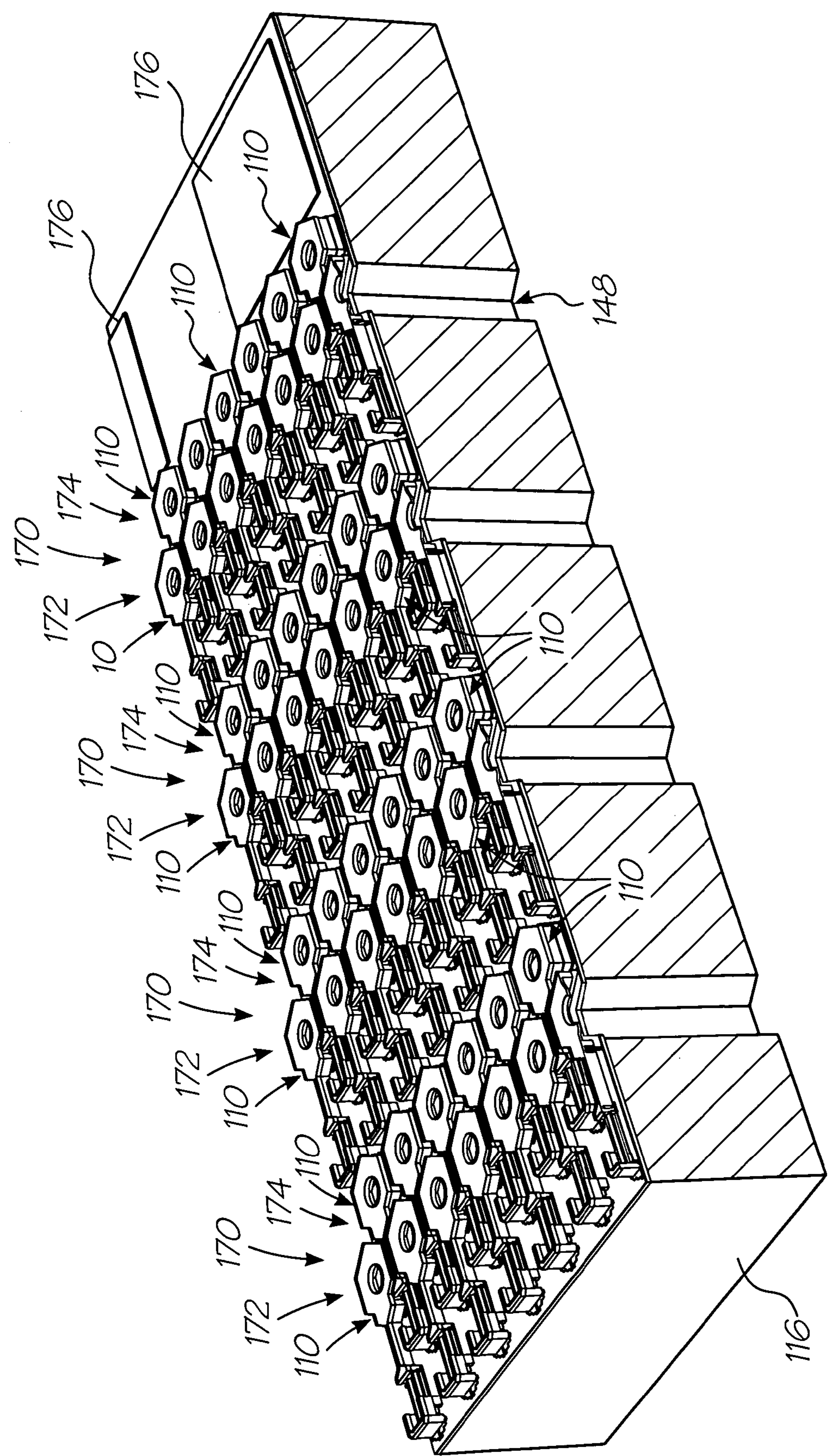
FIG. 21 shows a three dimensional view of a nozzle array constituting an ink jet printhead.
Figure 22:
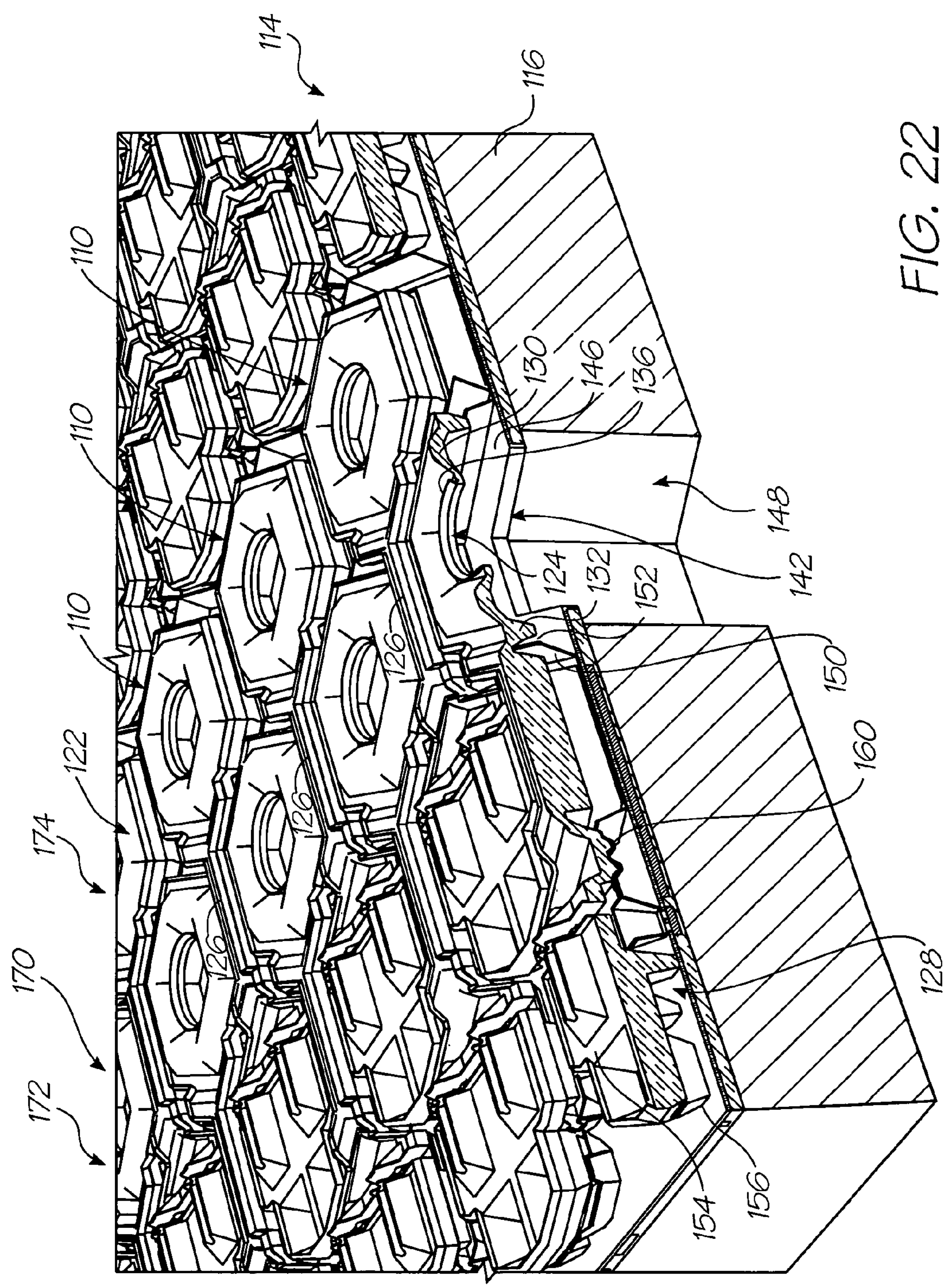
FIG. 22 shows, on an enlarged scale, part of the array of FIG. 21.

Referring now to FIGS. 21 and 22 of the drawings, the nozzle array 114 is described in greater detail. The array 114 is for a four color printhead. Accordingly, the array 114 includes four groups 170 of nozzle assemblies, one for each color. Each group 170 has its nozzle assemblies 110 arranged in two rows 172 and 174. One of the groups 170 is shown in greater detail in FIG. 22 of the drawings.

To facilitate close packing of the nozzle assemblies 110 in the rows 172 and 174, the nozzle assemblies 110 in the row 174 are offset or staggered with respect to the nozzle assemblies 110 in the row 172. Also, the nozzle assemblies 110 in the row 172 are spaced apart sufficiently far from each other to enable the lever arms 126 of the nozzle assemblies 110 in the row 174 to pass between adjacent nozzles 122 of the assemblies 110 in the row 172. It is to be noted that each nozzle assembly 110 is substantially dumbbell shaped so that the nozzles 122 in the row 172 nest between the nozzles 122 and the actuators 128 of adjacent nozzle assemblies 110 in the row 174.

Further, to facilitate close packing of the nozzles 122 in the rows 172 and 174, each nozzle 122 is substantially hexagonally shaped.

It will be appreciated by those skilled in the art that, when the nozzles 122 are displaced towards the substrate 116, in use, due to the nozzle opening 124 being at a slight angle with respect to the nozzle chamber 134 ink is ejected slightly off the perpendicular. It is an advantage of the arrangement shown in FIGS. 21 and 22 of the drawings that the actuators 128 of the nozzle assemblies 110 in the rows 172 and 174 extend in the same direction to one side of the rows 172 and 174. Hence, the ink droplets ejected from the nozzles 122 in the row 172 and the ink droplets ejected from the nozzles 122 in the row 174 are parallel to one another resulting in an improved print quality.

Also, as shown in FIG. 21 of the drawings, the substrate 116 has bond pads 176 arranged thereon which provide the electrical connections, via the pads 156, to the actuators 128 of the nozzle assemblies 110. These electrical connections are formed via the CMOS layer (not shown).

Figure 23:
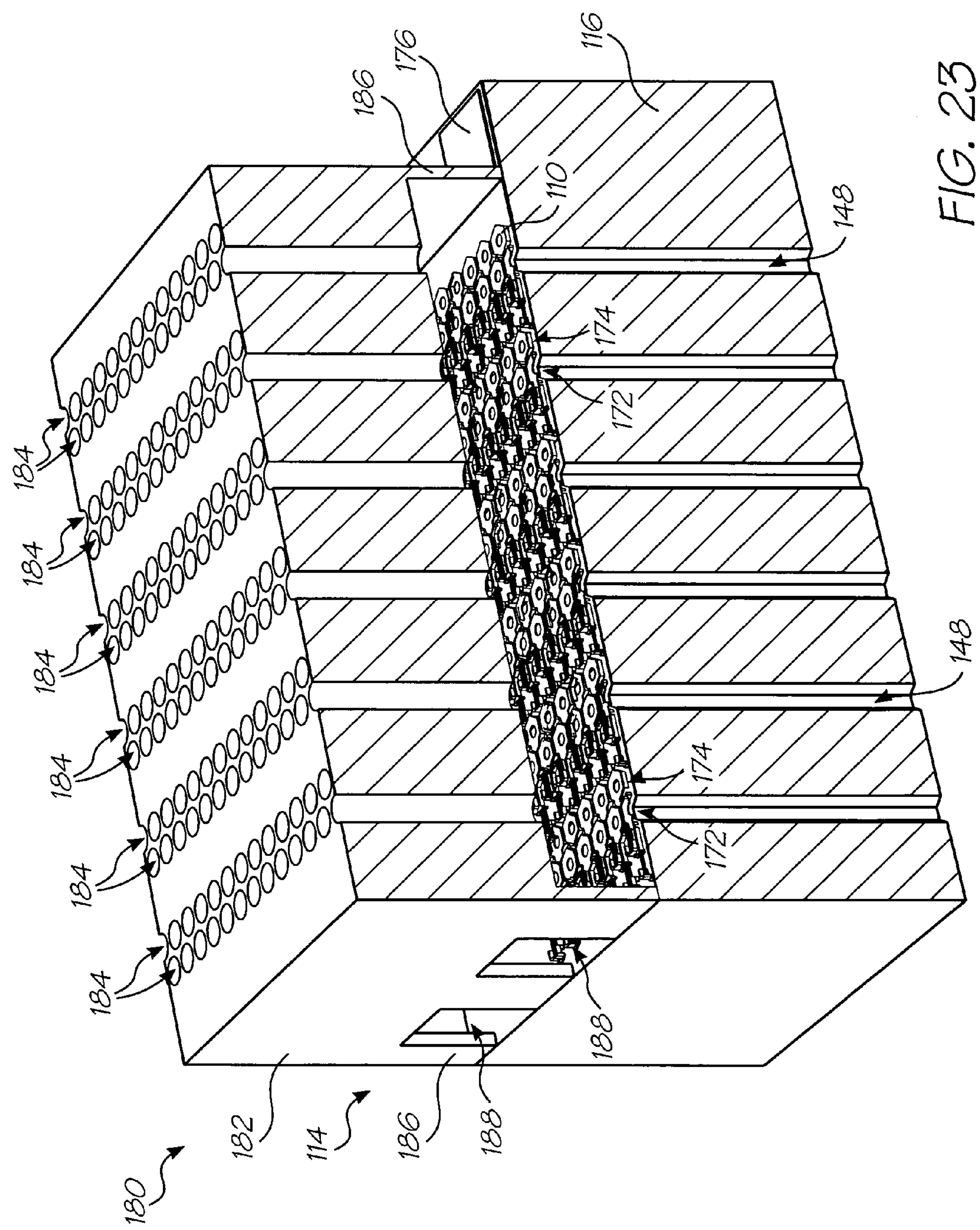
FIG. 23 shows a three dimensional view of an ink jet printhead including a nozzle guard.
Figure 25A:
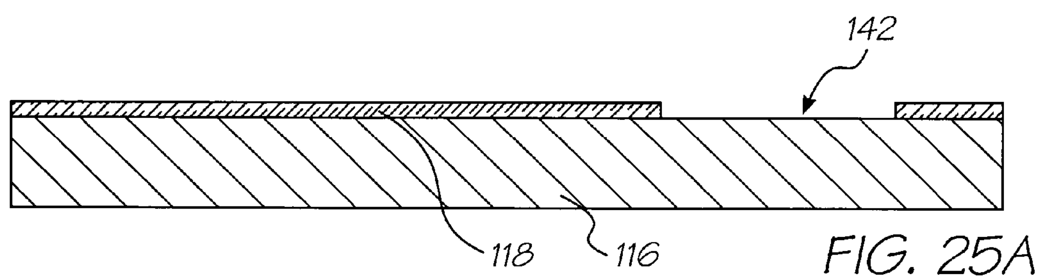
Figure 26A:
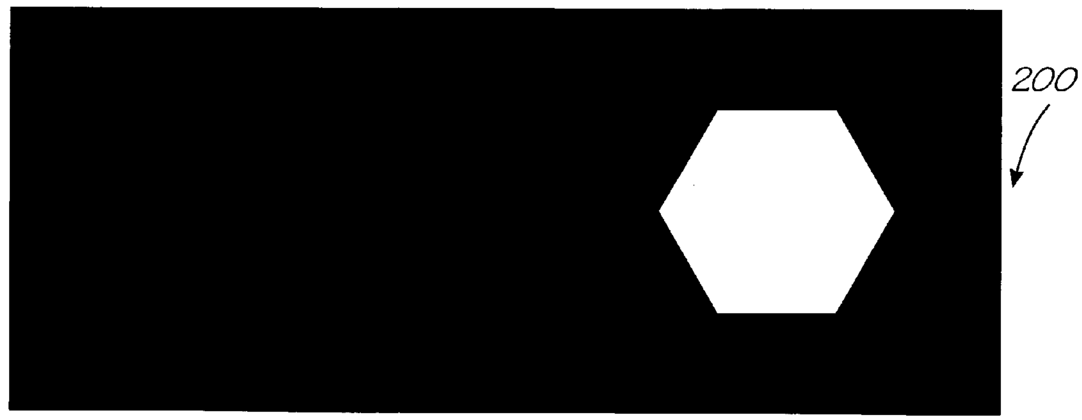
Figure 25B:
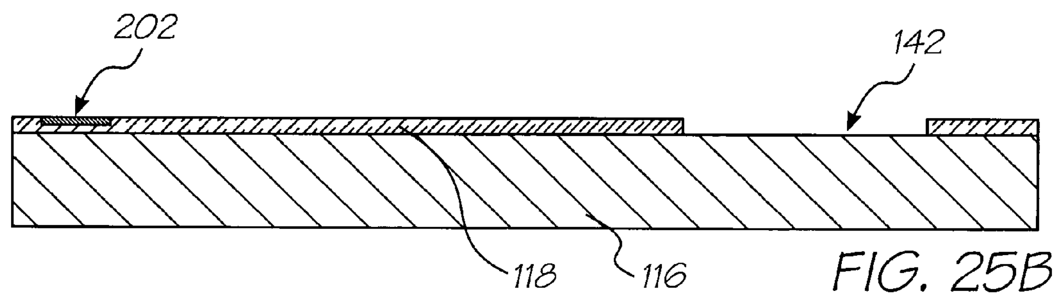
Figure 26B:
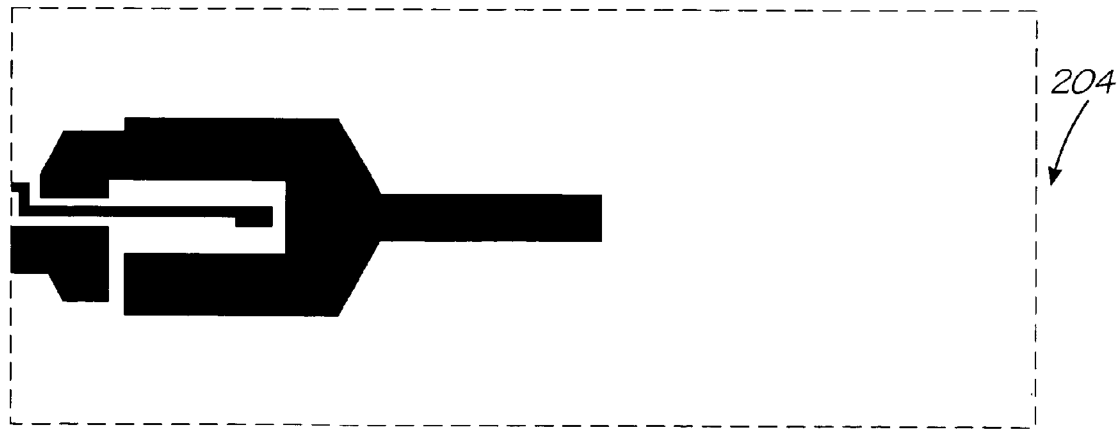
Figure 25D:
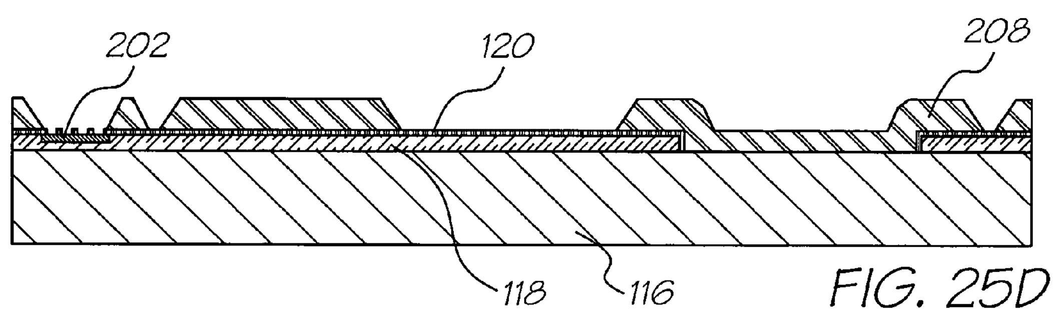
Figure 26D:
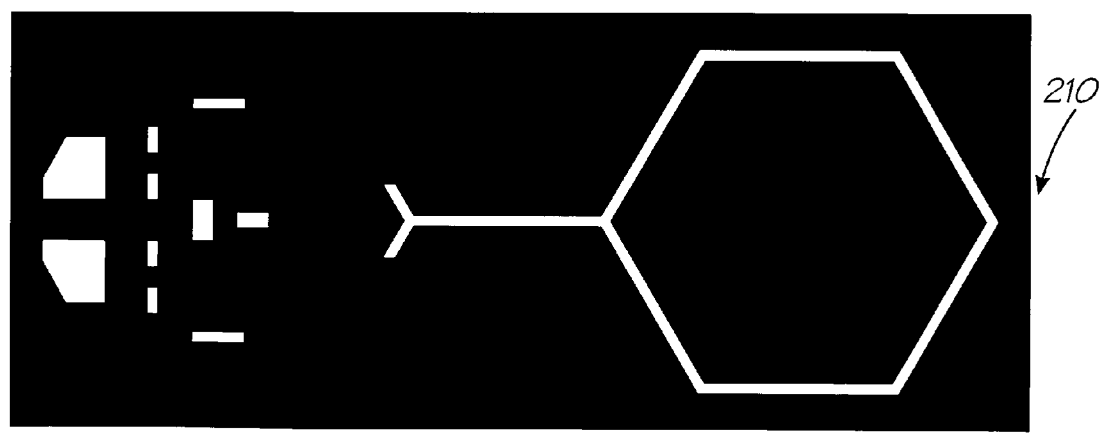

Referring to FIG. 23 of the drawings, a development of the invention is shown. With reference to the previous drawings, like reference numerals refer to like parts, unless otherwise specified.

In this development, a nozzle guard 180 is mounted on the substrate 116 of the array 114. The nozzle guard 180 includes a body member 182 having a plurality of passages 184 defined therethrough. The passages 184 are in register with the nozzle openings 124 of the nozzle assemblies 110 of the array 114 such that, when ink is ejected from any one of the nozzle openings 124, the ink passes through the associated passage 184 before striking the print media.

The body member 182 is mounted in spaced relationship relative to the nozzle assemblies 110 by limbs or struts 186. One of the struts 186 has air inlet openings 188 defined therein.

In use, when the array 114 is in operation, air is charged through the inlet openings 188 to be forced through the passages 184 together with ink travelling through the passages 184.

The ink is not entrained in the air as the air is charged through the passages 184 at a different velocity from that of the ink droplets 164. For example, the ink droplets 164 are ejected from the nozzles 122 at a velocity of approximately 3m/s. The air is charged through the passages 184 at a velocity of approximately 1 m/s.

The purpose of the air is to maintain the passages 184 clear of foreign particles. A danger exists that these foreign particles, such as dust particles, could fall onto the nozzle assemblies 110 adversely affecting their operation. With the provision of the air inlet openings 88 in the nozzle guard 180 this problem is, to a large extent, obviated.

Referring now to FIG. 24 to 26 of the drawings, a process for manufacturing the nozzle assemblies 110 is described.

Starting with the silicon substrate or wafer 116, the dielectric layer 118 is deposited on a surface of the wafer 116. The dielectric layer 118 is in the form of approximately 1.5 microns of CVD oxide. Resist is spun on to the layer 118 and the layer 118 is exposed to mask 200 and is subsequently developed.

After being developed, the layer 118 is plasma etched down to the silicon layer 116. The resist is then stripped and the layer 118 is cleaned. This step defines the ink inlet aperture 142.

In FIG. 37*b* of the drawings, approximately 0.8 microns of aluminum 202 is deposited on the layer 118. Resist is spun on and the aluminum 202 is exposed to mask 204 and developed. The aluminum 202 is plasma etched down to the oxide layer 118, the resist is stripped and the device is cleaned. This step provides the bond pads and interconnects to the ink jet actuator 128. This interconnect is to an NMOS drive transistor and a power plane with connections made in the CMOS layer (not shown).

Approximately 0.5 microns of PECVD nitride is deposited as the CMOS passivation layer 120. Resist is spun on and the layer 120 is exposed to mask 206 whereafter it is developed. After development, the nitride is plasma etched down to the aluminum layer 202 and the silicon layer 116 in the region of the inlet aperture 142. The resist is stripped and the device cleaned.

A layer 208 of a sacrificial material is spun on to the layer 120. The layer 208 is 6 microns of photo-sensitive polyimide or approximately 4 μm of high temperature resist. The layer 208 is softbaked and is then exposed to mask 210 whereafter it is developed. The layer 208 is then hardbaked at 400° C. for one hour where the layer 208 is comprised of polyimide or at greater than 300° C. where the layer 208 is high temperature resist. It is to be noted in the drawings that the pattern-dependent distortion of the polyimide layer 208 caused by shrinkage is taken into account in the design of the mask 210.

Figure 24A:
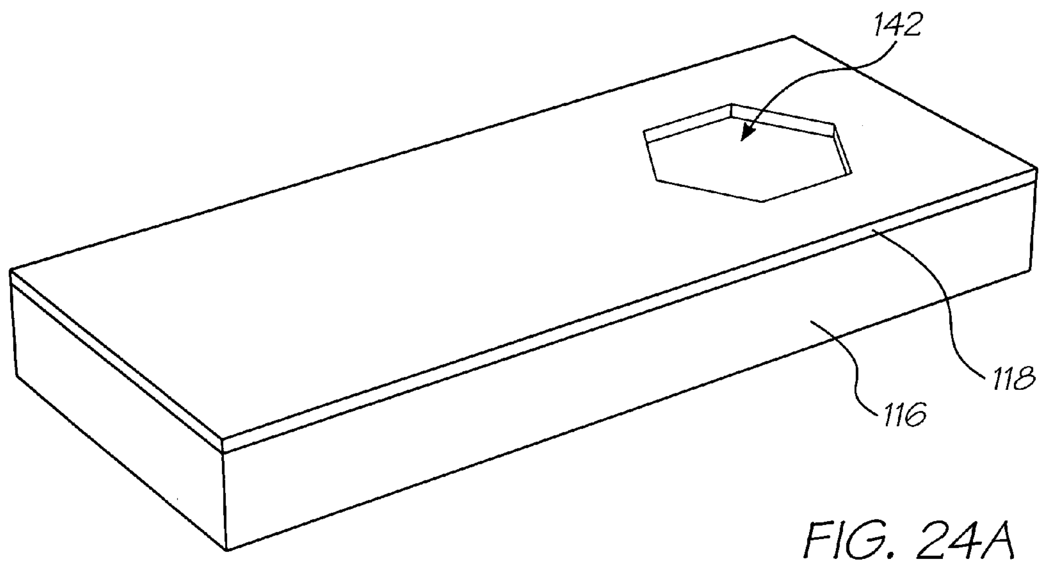
Figure 24B:
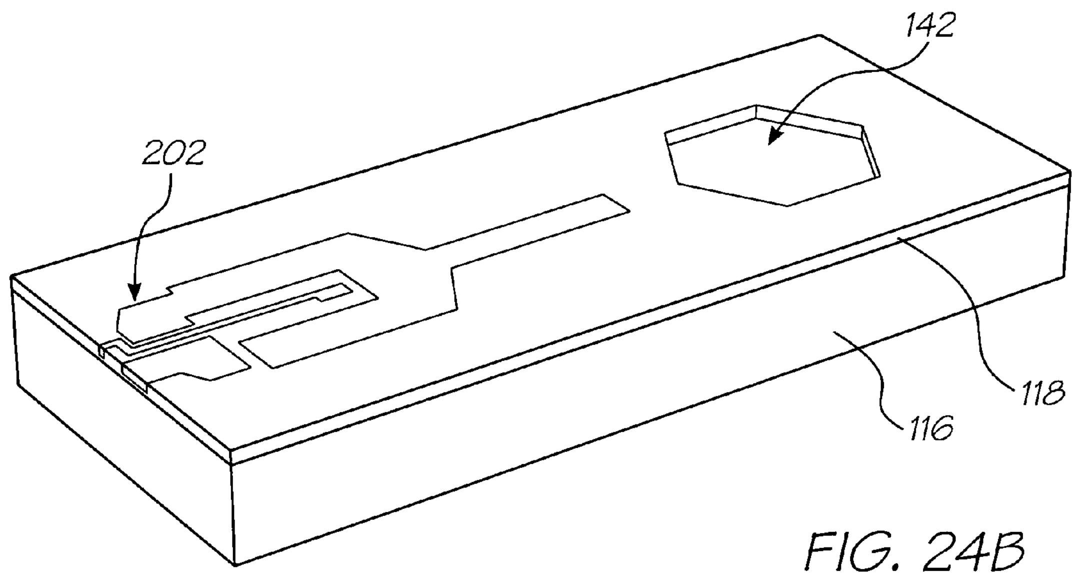
Figure 24D:
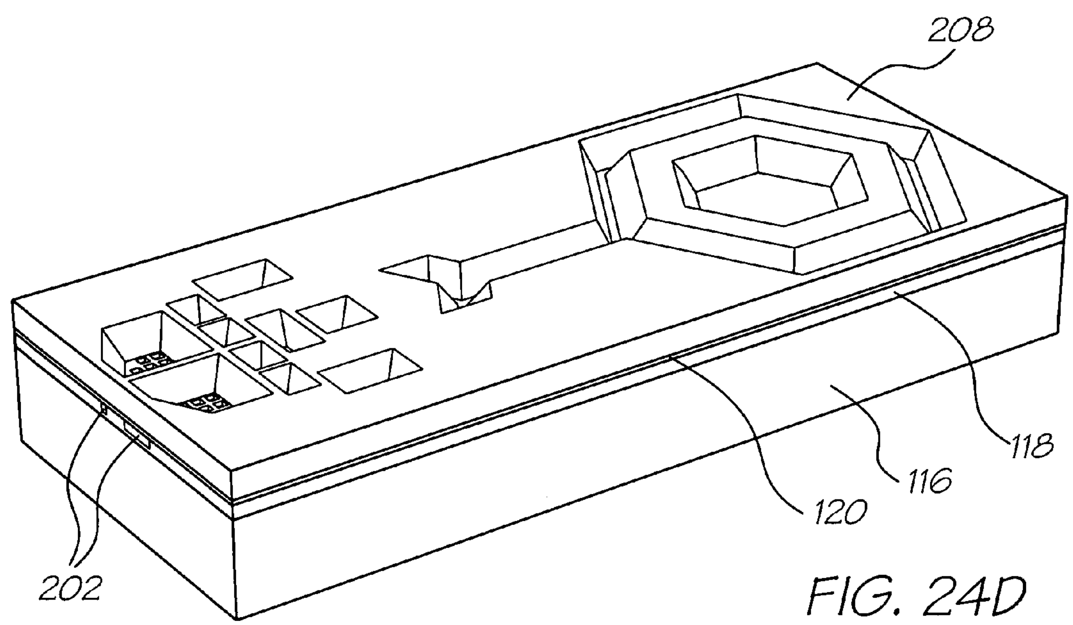
Figure 24E:
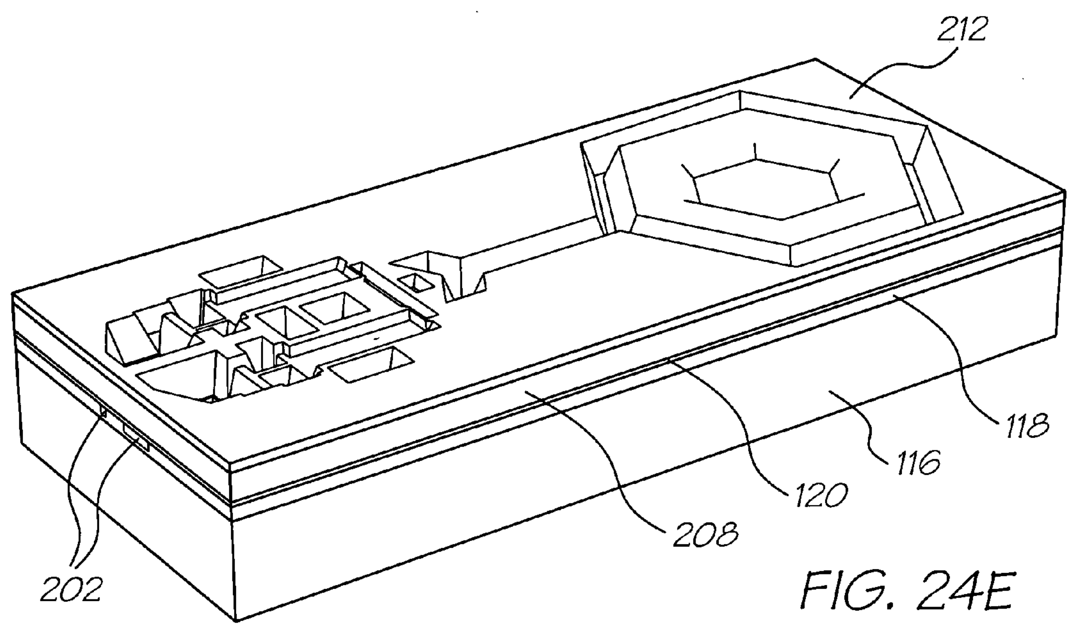
Figure 25E:
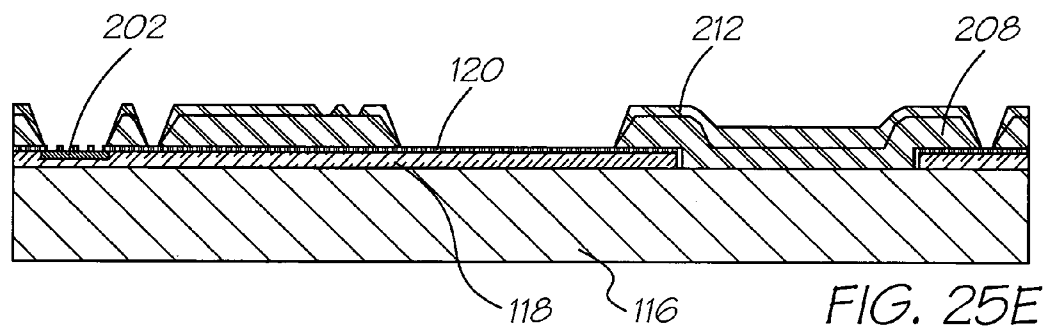
Figure 26E:
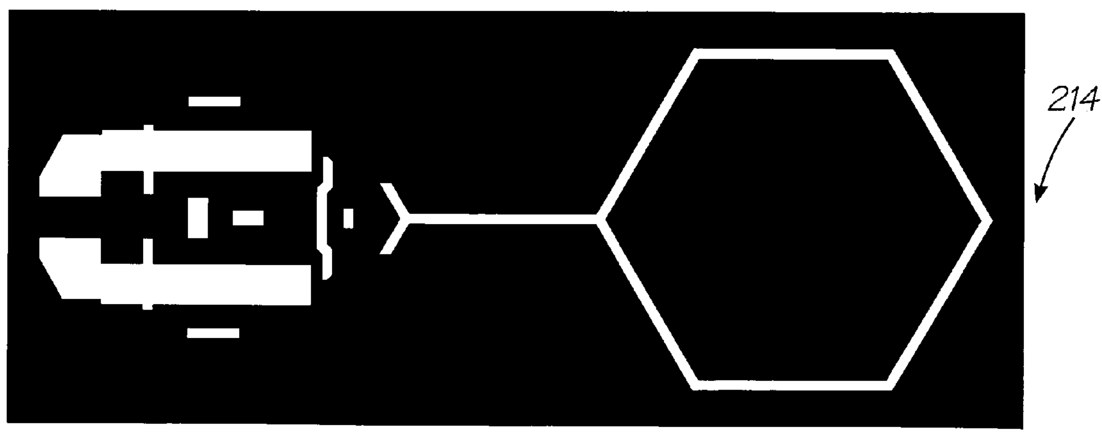
Figure 24F:
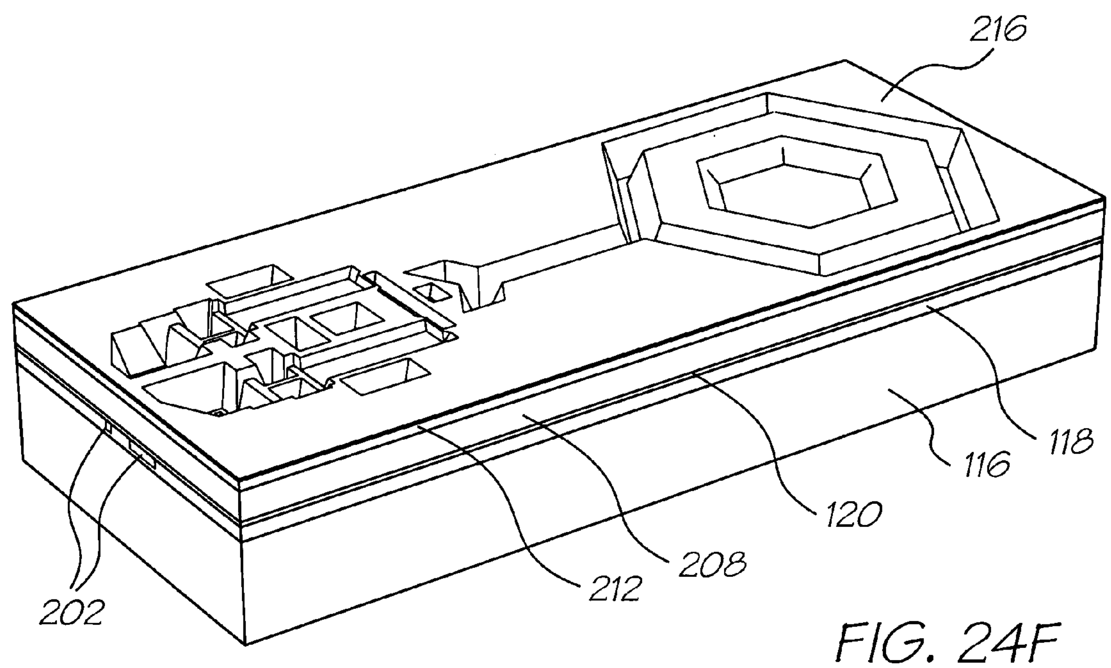
Figure 25F:
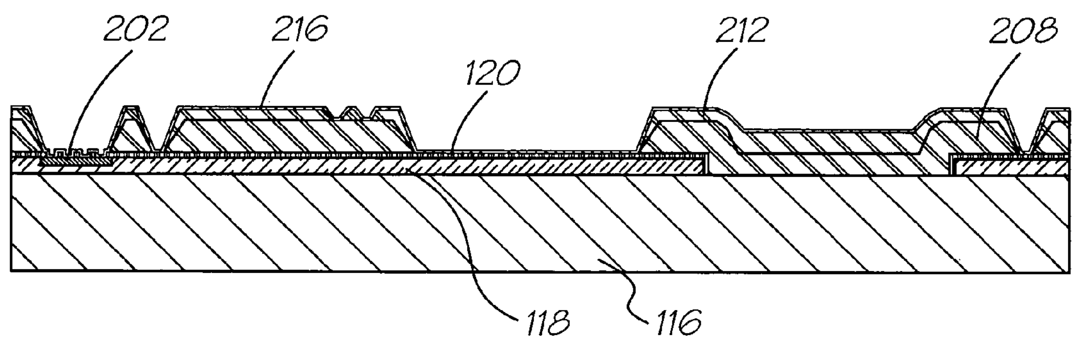
Figure 24G:
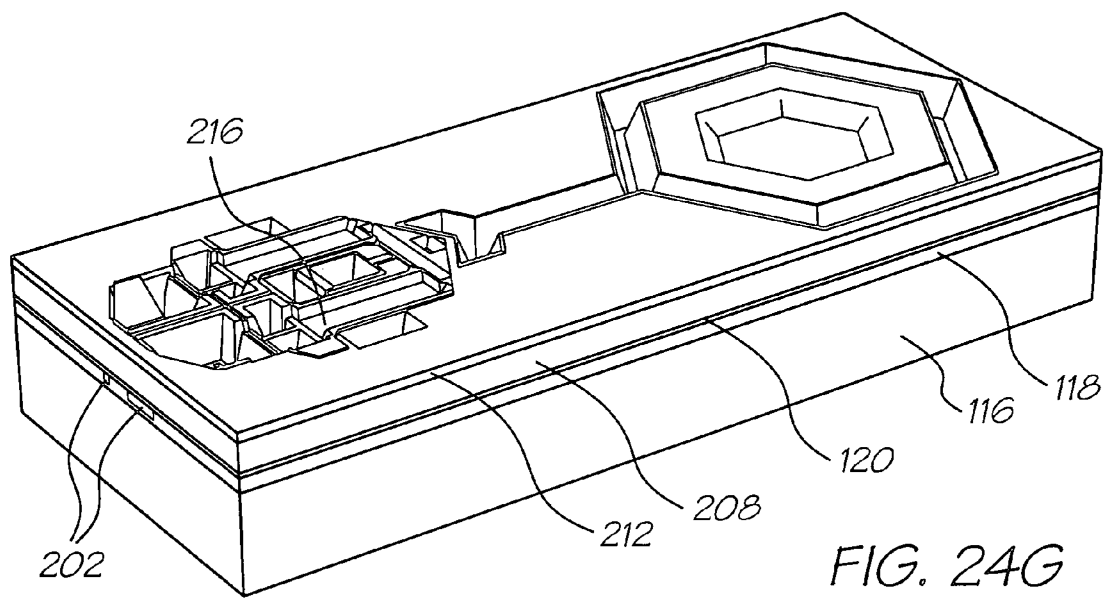
Figure 25G:
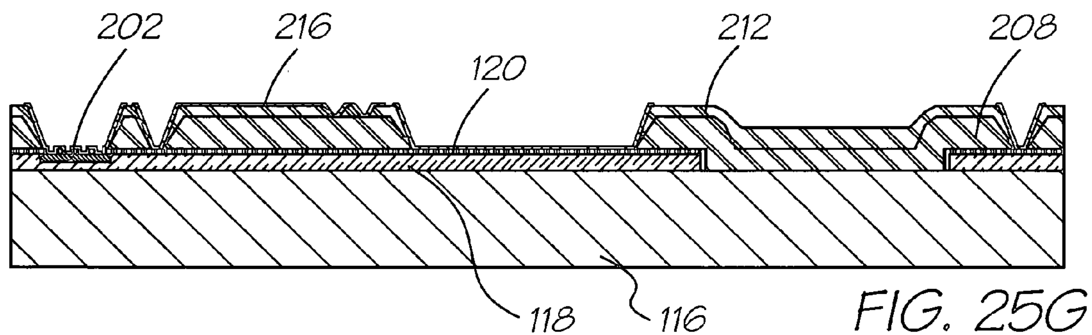
Figure 26F:
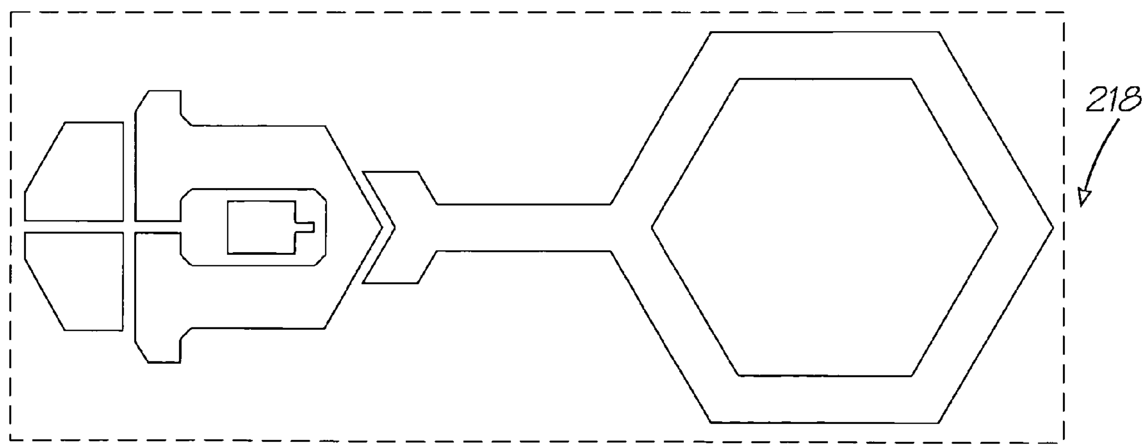
Figure 24H:
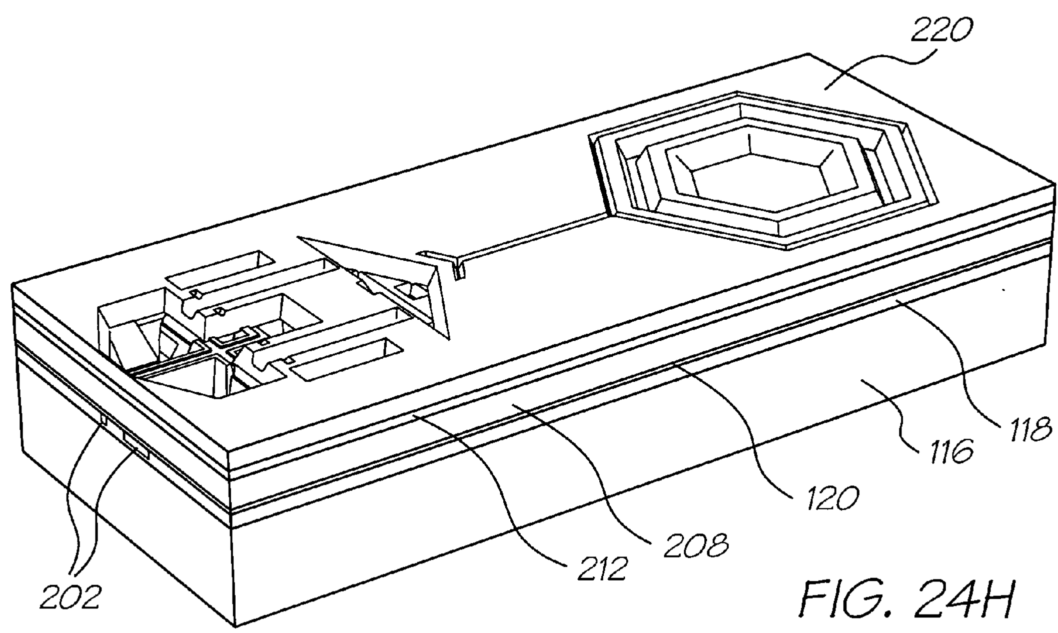
Figure 25H:
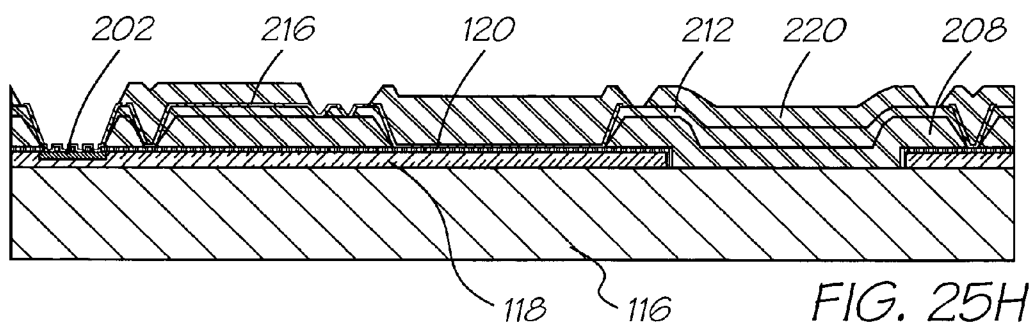
Figure 26G:
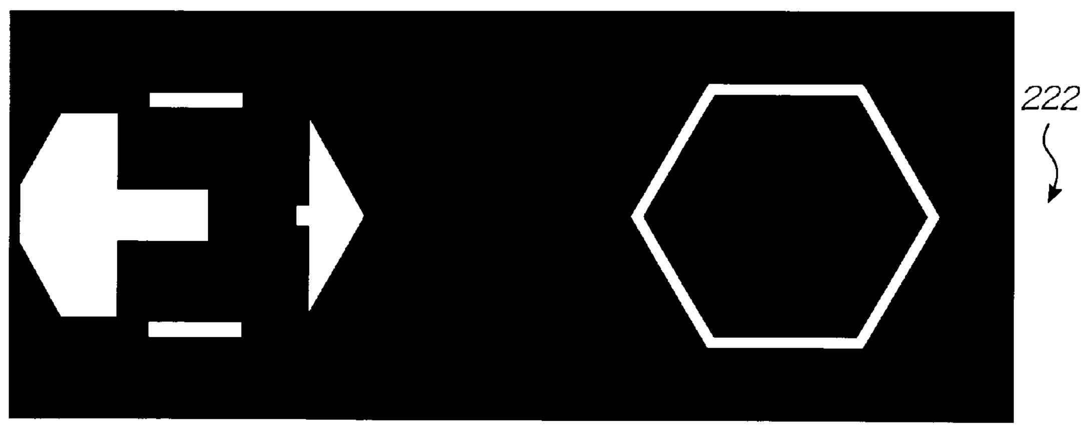
Figure 24I:
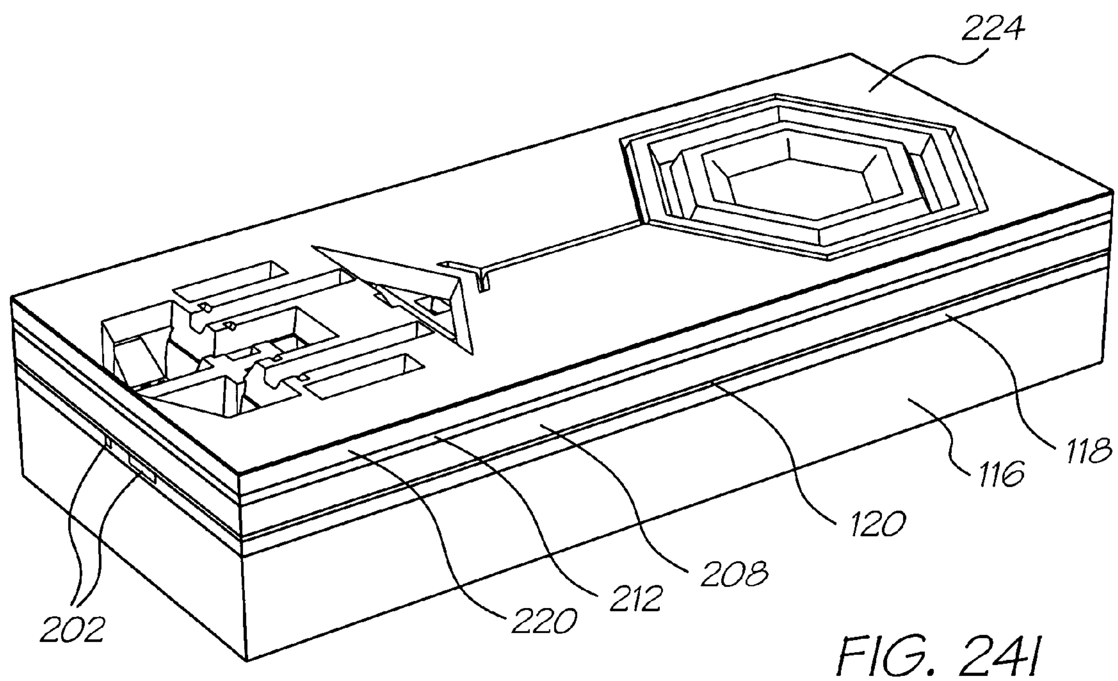
Figure 25I:
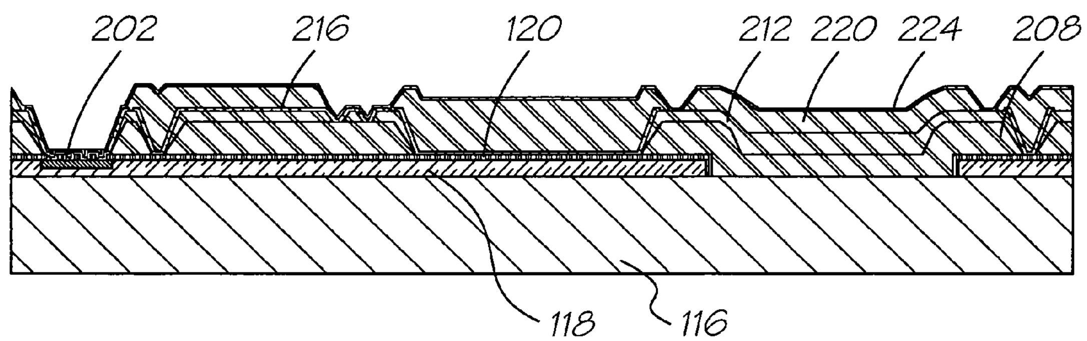
Figure 24J:
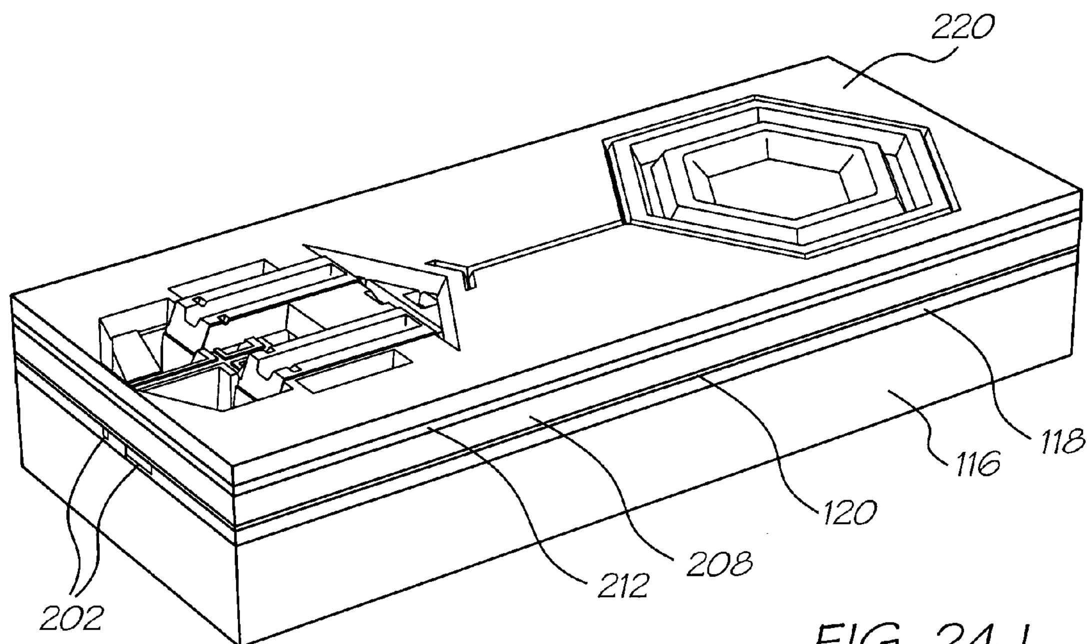
Figure 25J:
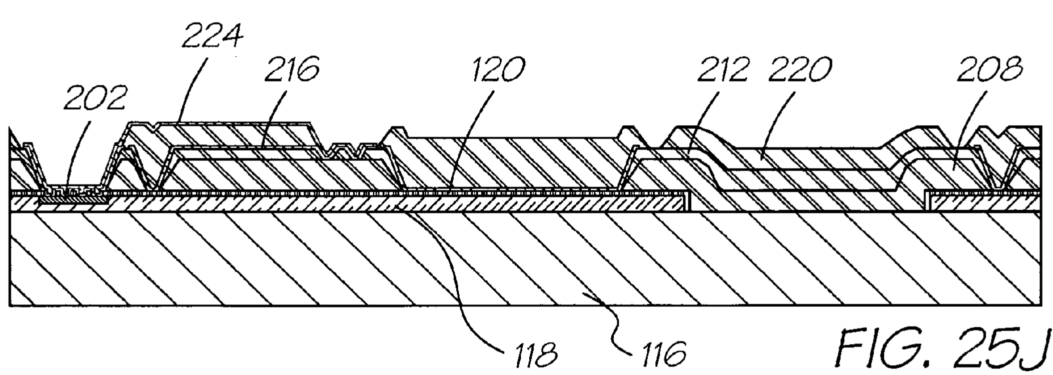
Figure 26H:
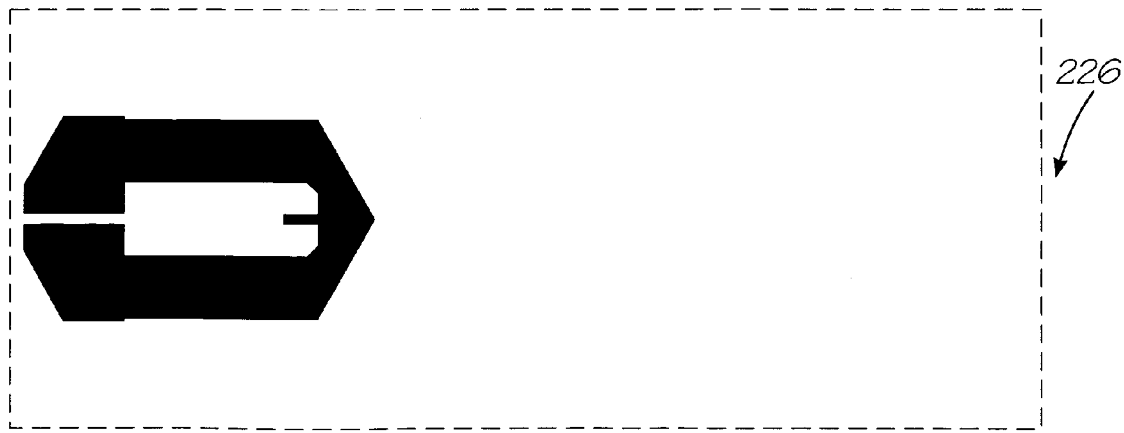
Figure 24K:
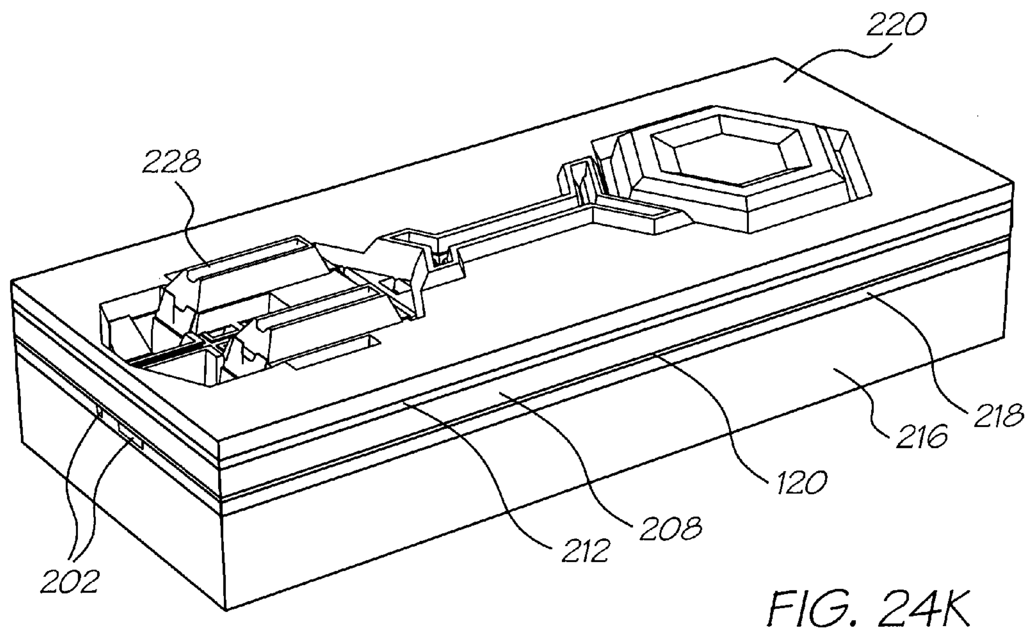
Figure 25K:
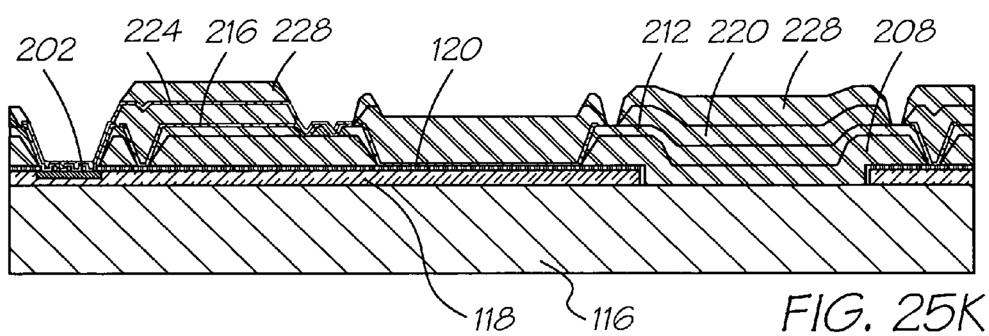
Figure 26I:
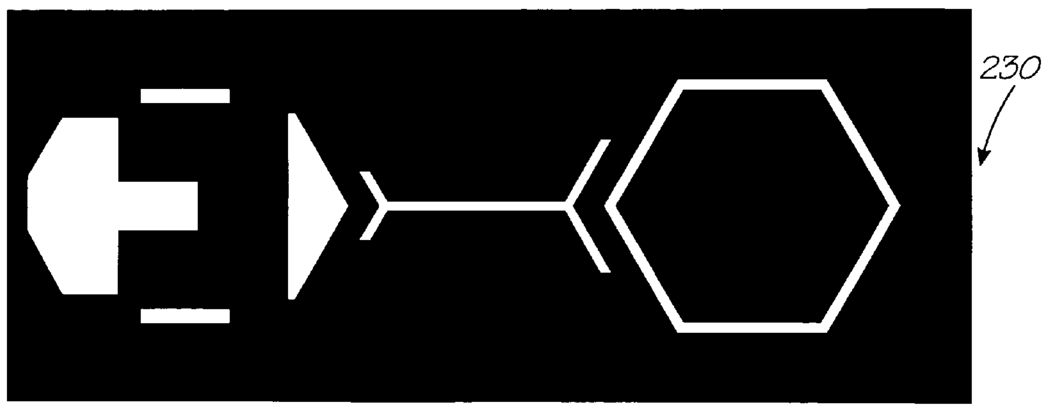

In the next step, shown in FIG. 24*e* of the drawings, a second sacrificial layer 212 is applied. The layer 212 is either 2 μm of photo-sensitive polyimide which is spun on or approximately 1.3 μm of high temperature resist. The layer 212 is softbaked and exposed to mask 214. After exposure to the mask 214, the layer 212 is developed. In the case of the layer 212 being polyimide, the layer 212 is hardbaked at 400° C. for approximately one hour. Where the layer 212 is resist, it is hardbaked at greater than 300° C. for approximately one hour.

A 0.2 micron multi-layer metal layer 216 is then deposited. Part of this layer 216 forms the passive beam 160 of the actuator 128.

The layer 216 is formed by sputtering 1,000 Å of titanium nitride (TiN) at around 300° C. followed by sputtering 50 Å of tantalum nitride (TaN). A further 1,000 Å of TiN is sputtered on followed by 50 Å of TaN and a further 1,000 Å of TiN.

Other materials which can be used instead of TiN are $TiB_2$, $MoSi_2$ or (Ti, Al)N.

The layer 216 is then exposed to mask 218, developed and plasma etched down to the layer 212 whereafter resist, applied for the layer 216, is wet stripped taking care not to remove the cured layers 208 or 212.

A third sacrificial layer 220 is applied by spinning on 4 μm of photo-sensitive polyimide or approximately 2.6 μm high temperature resist. The layer 220 is softbaked whereafter it is exposed to mask 222. The exposed layer is then developed followed by hardbaking. In the case of polyimide, the layer 220 is hardbaked at 400° C. for approximately one hour or at greater than 300° C. where the layer 220 comprises resist.

A second multi-layer metal layer 224 is applied to the layer 220. The constituents of the layer 224 are the same as the layer 216 and are applied in the same manner. It will be appreciated that both layers 216 and 224 are electrically conductive layers.

The layer 224 is exposed to mask 226 and is then developed. The layer 224 is plasma etched down to the polyimide or resist layer 220 whereafter resist applied for the layer 224 is wet stripped taking care not to remove the cured layers 208, 212 or 220. It will be noted that the remaining part of the layer 224 defines the active beam 158 of the actuator 128.

A fourth sacrificial layer 228 is applied by spinning on 4 μm of photo-sensitive polyimide or approximately 2.6 μm of high temperature resist. The layer 228 is softbaked, exposed to the mask 230 and is then developed to leave the island portions as shown in FIG. 9*k* of the drawings. The remaining portions of the layer 228 are hardbaked at 400° C. for approximately one hour in the case of polyimide or at greater than 300° C. for resist.

Figure 24L:
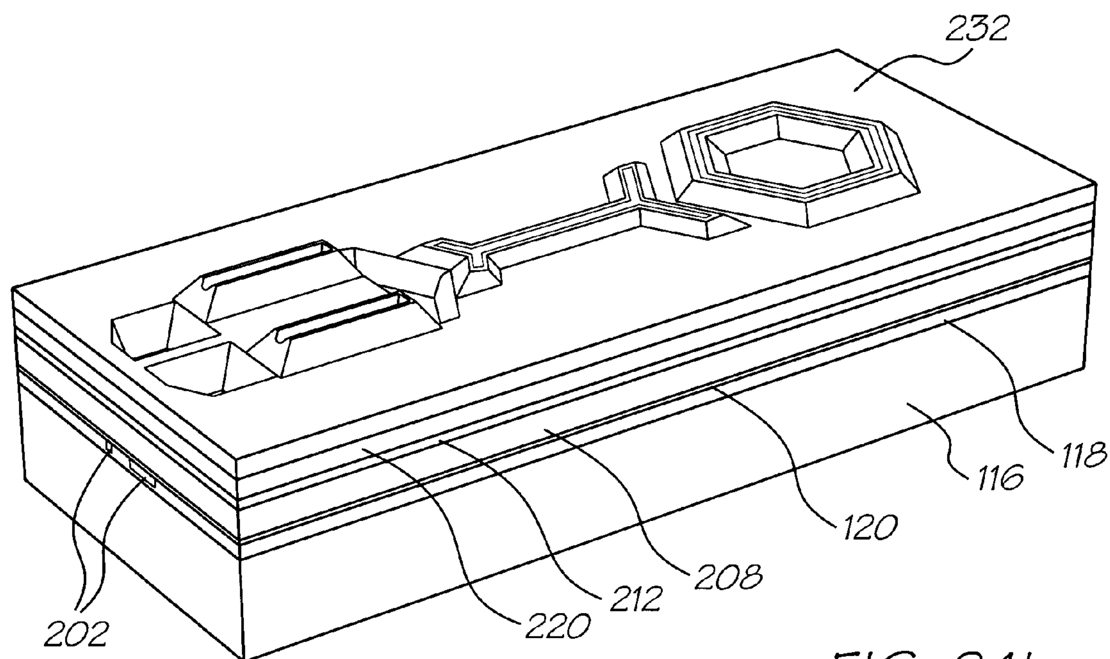
Figure 25L:
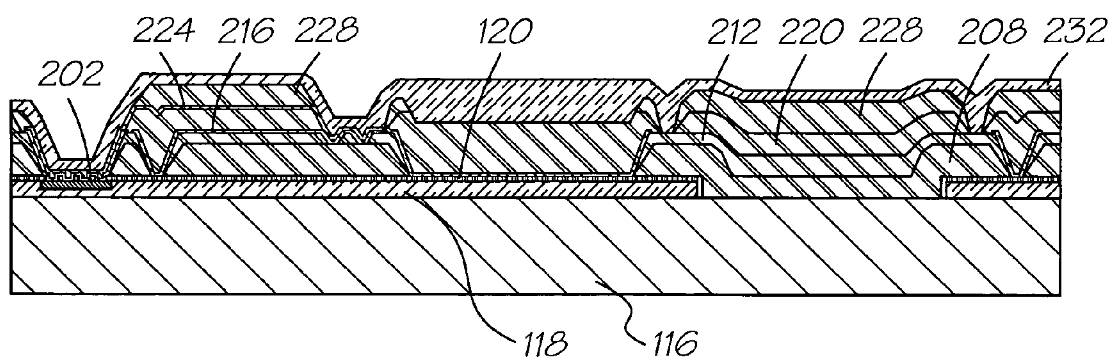
Figure 24M:
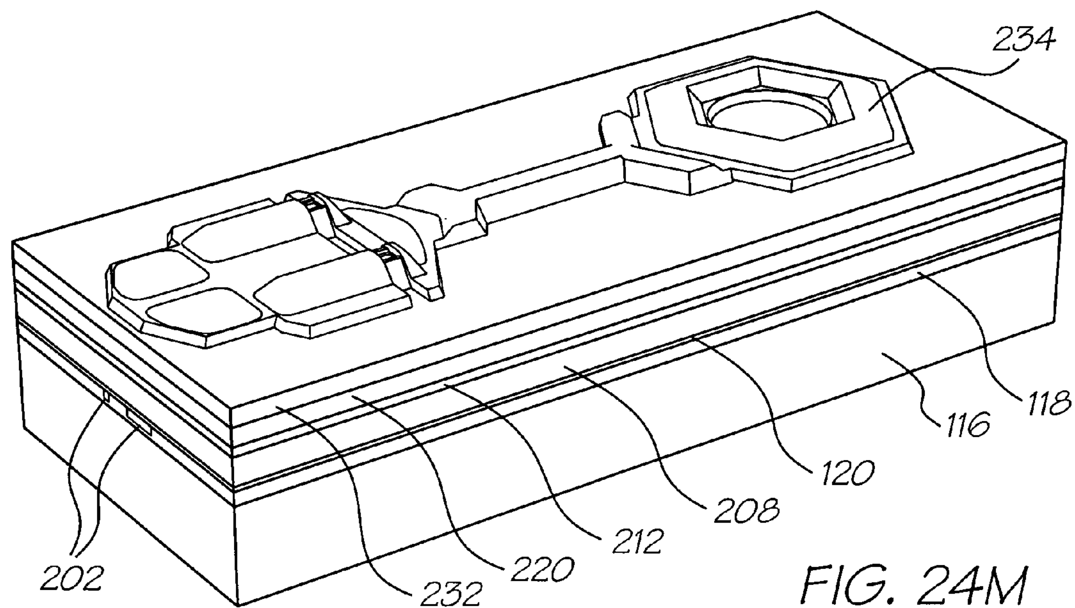
Figure 25M:
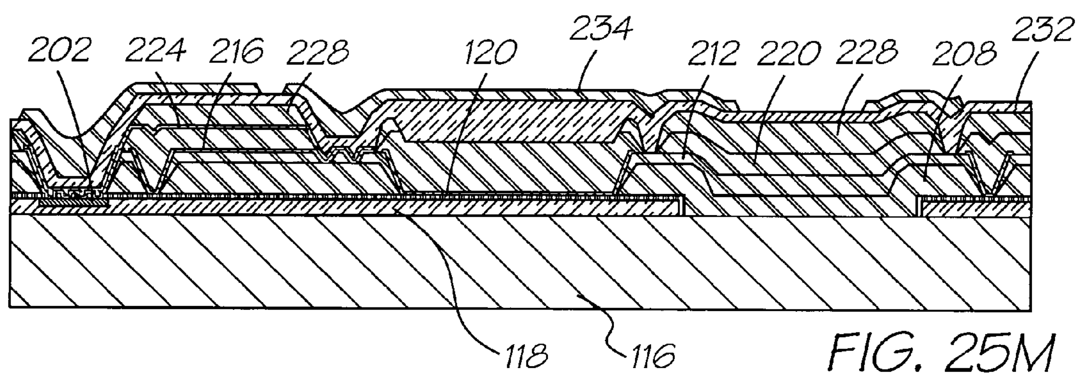
Figure 26J:
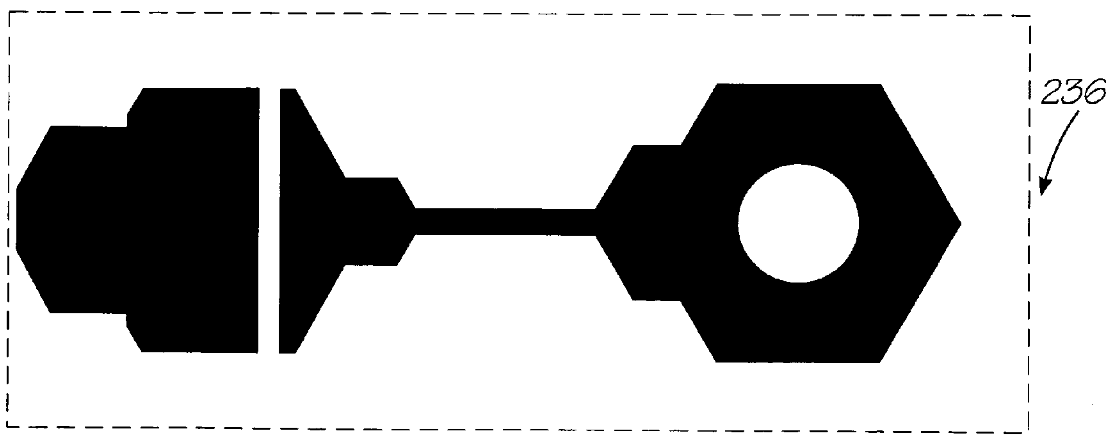
Figure 24N:
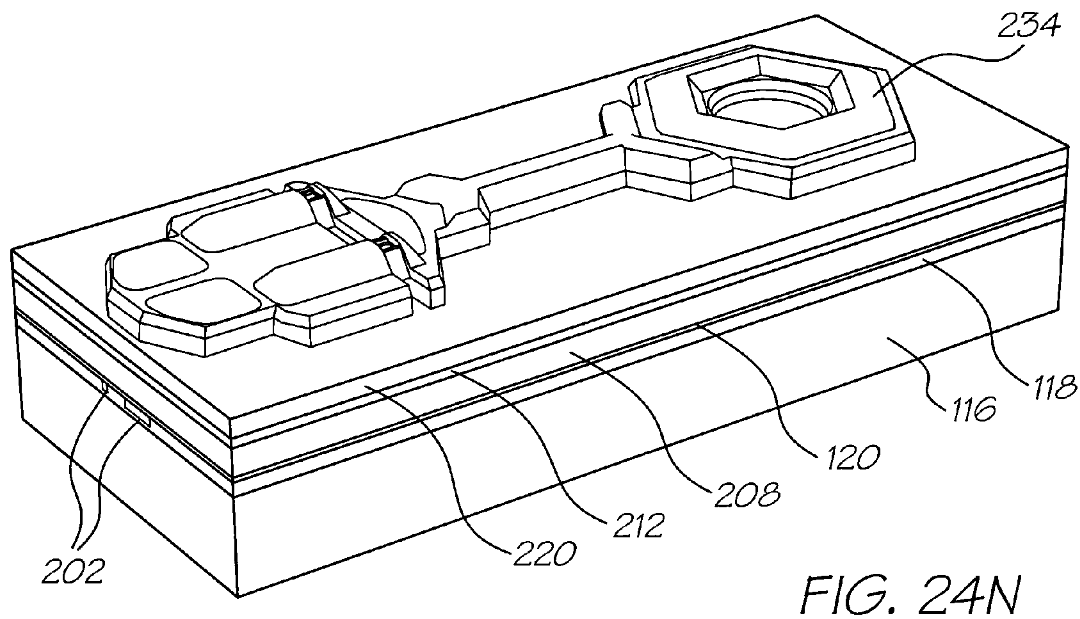
Figure 25N:
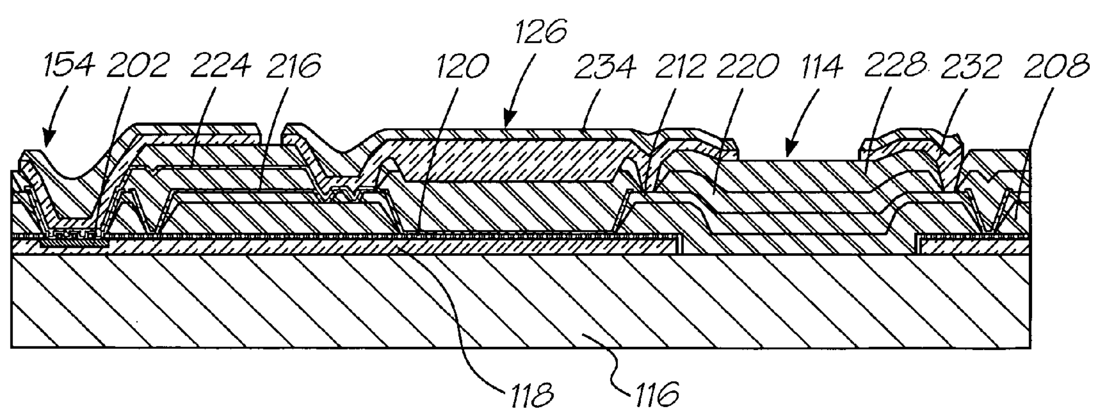
Figure 240:
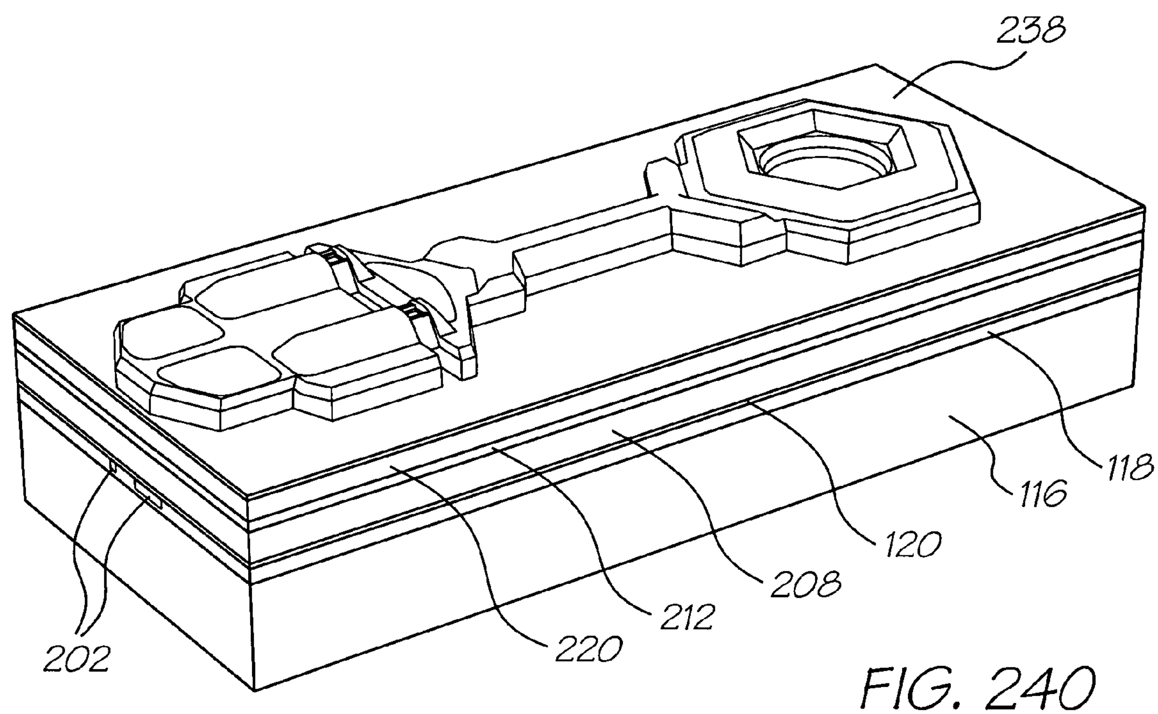
Figure 250:
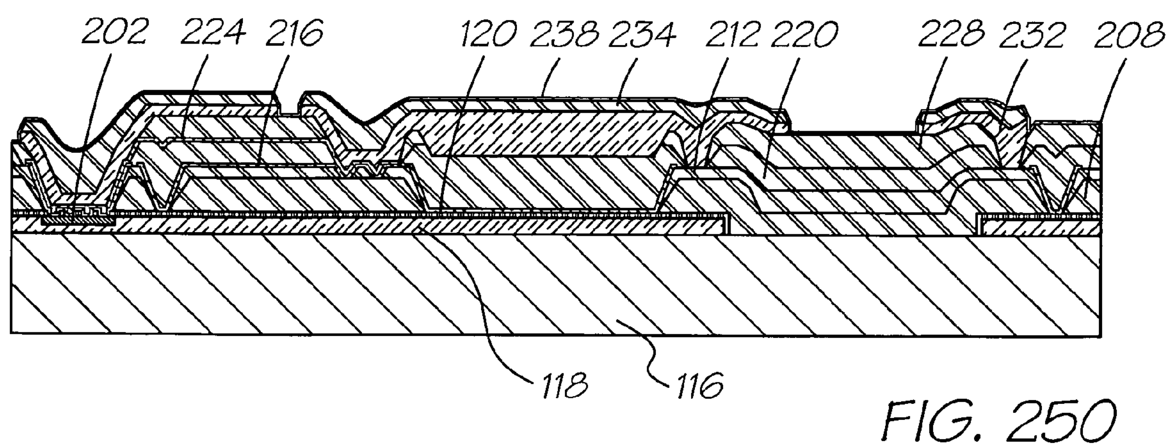

As shown in FIG. 24*l* of the drawing a high Young's modulus dielectric layer 232 is deposited. The layer 232 is constituted by approximately 1 μm of silicon nitride or aluminum oxide. The layer 232 is deposited at a temperature below the hardbaked temperature of the sacrificial layers 208, 212, 220, 228. The primary characteristics required for this dielectric layer 232 are a high elastic modulus, chemical inertness and good adhesion to TiN.

A fifth sacrificial layer 234 is applied by spinning on 2 μm of photo-sensitive polyimide or approximately 1.3 μm of high temperature resist. The layer 234 is softbaked, exposed to mask 236 and developed. The remaining portion of the layer 234 is then hardbaked at 400° C. for one hour in the case of the polyimide or at greater than 300° C. for the resist.

The dielectric layer 232 is plasma etched down to the sacrificial layer 228 taking care not to remove any of the sacrificial layer 234.

This step defines the nozzle opening 124, the lever arm 126 and the anchor 154 of the nozzle assembly 110.

A high Young's modulus dielectric layer 238 is deposited. This layer 238 is formed by depositing 0.2 μm of silicon nitride or aluminum nitride at a temperature below the hardbaked temperature of the sacrificial layers 208, 212, 220 and 228.

Figure 24P:
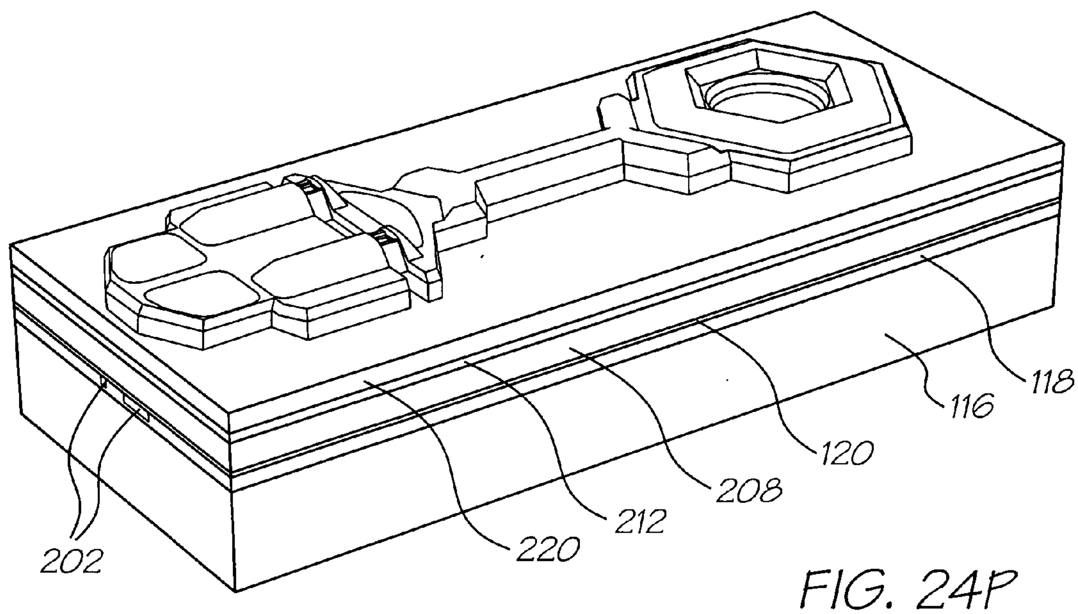
Figure 25P:
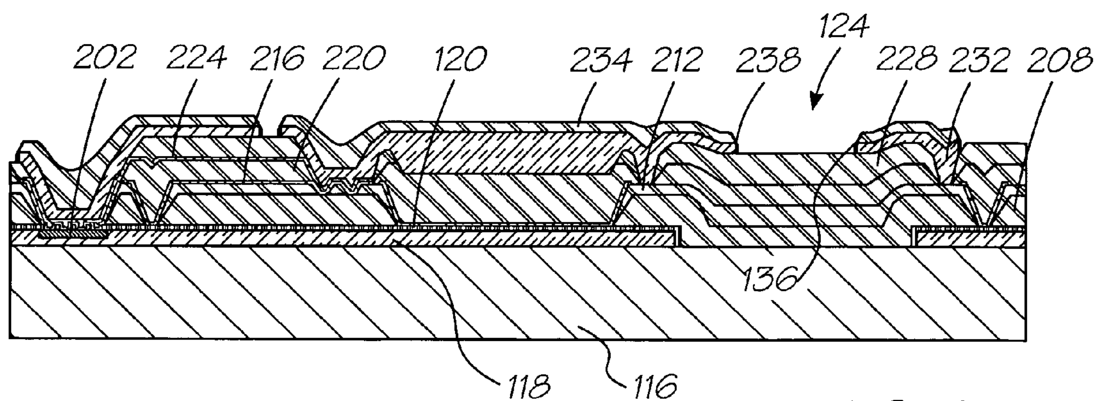
Figure 24Q:
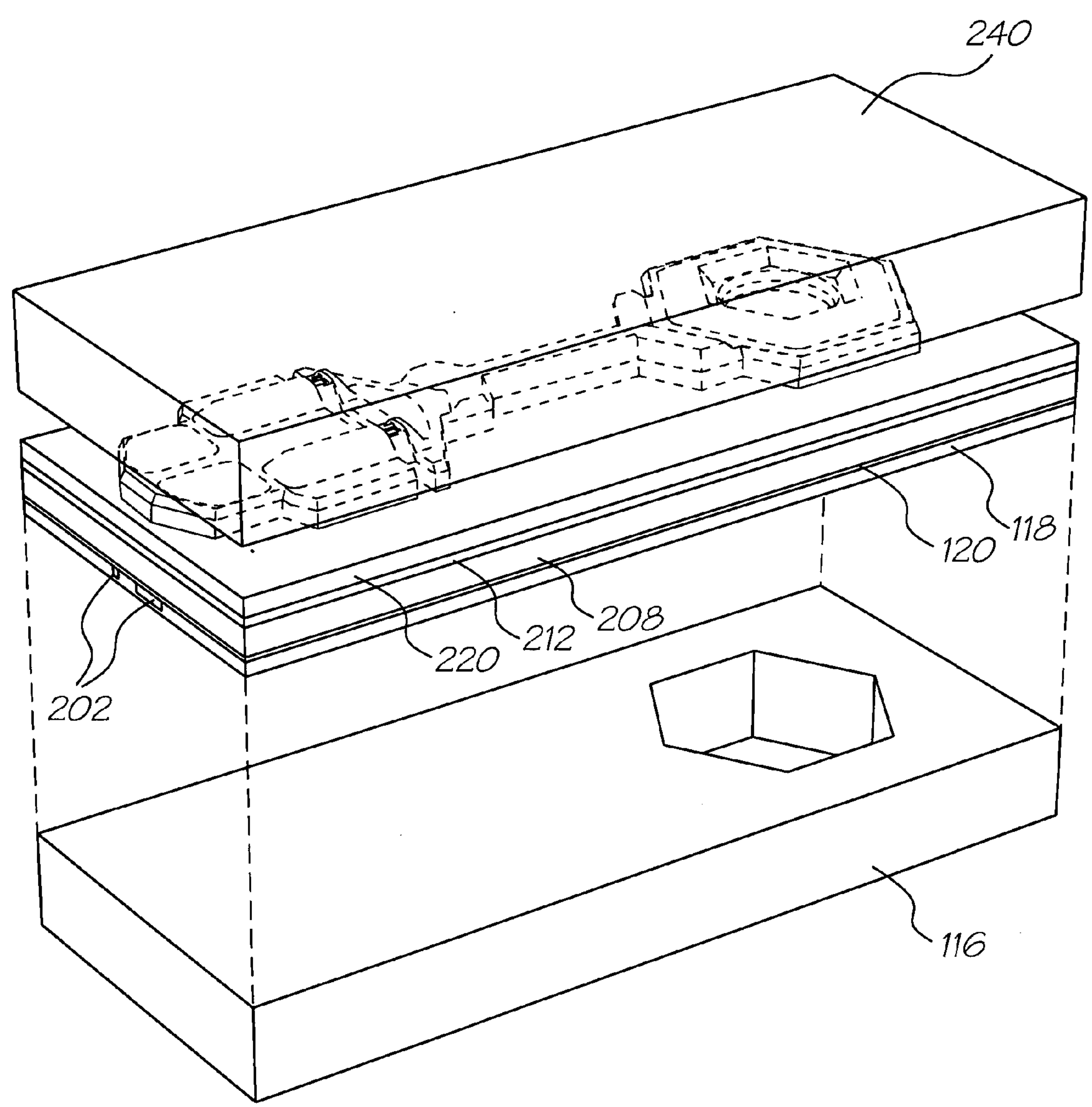
Figure 25Q:
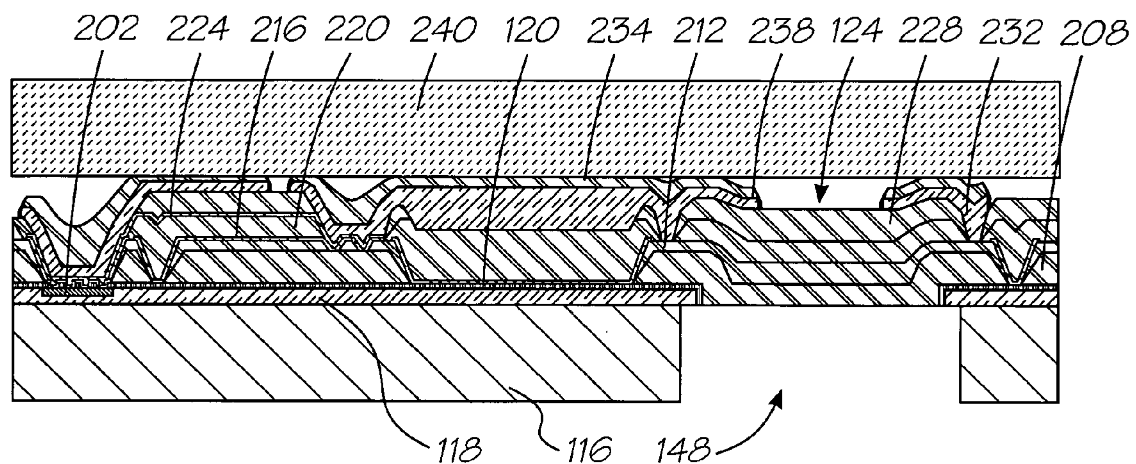
Figure 26K:
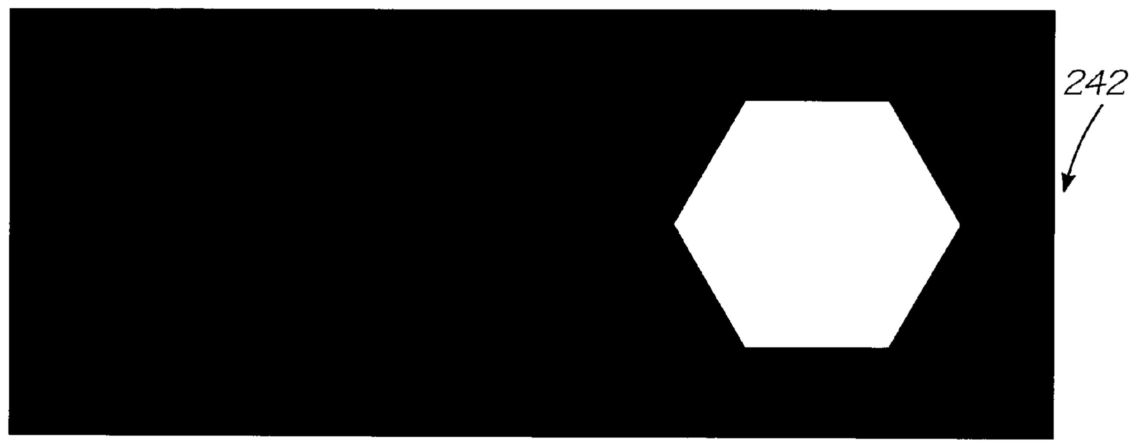

Then, as shown in FIG. 24*p* of the drawings, the layer 238 is anisotropically plasma etched to a depth of 0.35 microns. This etch is intended to clear the dielectric from all of the surface except the side walls of the dielectric layer 232 and the sacrificial layer 234. This step creates the nozzle rim 136 around the nozzle opening 124 which "pins" the meniscus of ink, as described above.

An ultraviolet (UV) release tape 240 is applied. 4 μm of resist is spun on to a rear of the silicon wafer 116. The wafer 116 is exposed to mask 242 to back etch the wafer 116 to define the ink inlet channel 148. The resist is then stripped from the wafer 116.

Figure 24R:
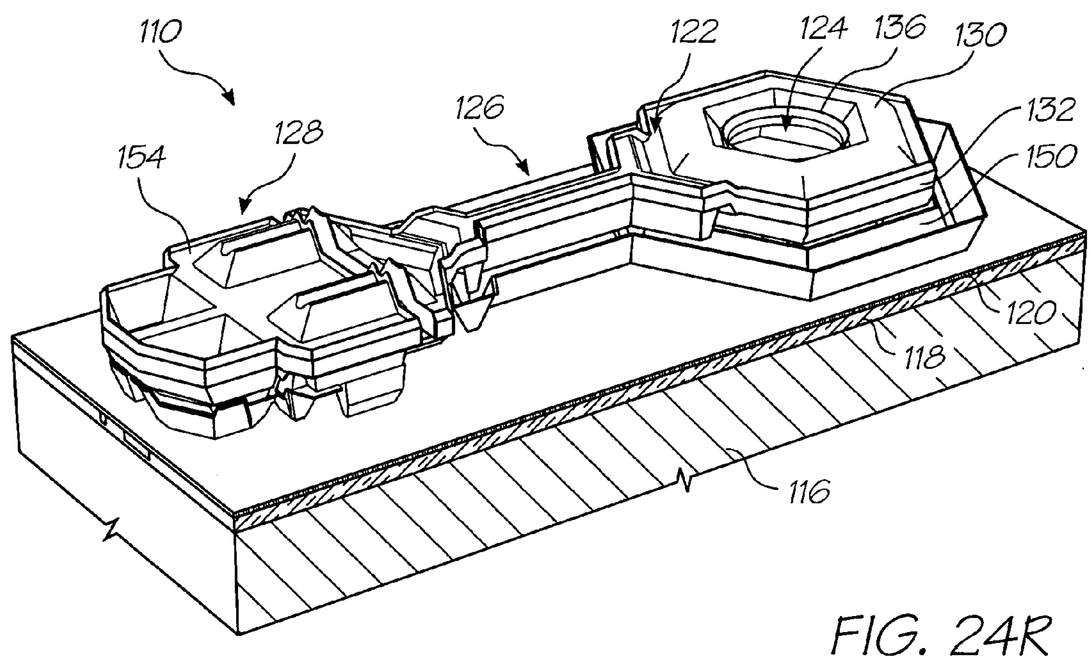
Figure 25R:
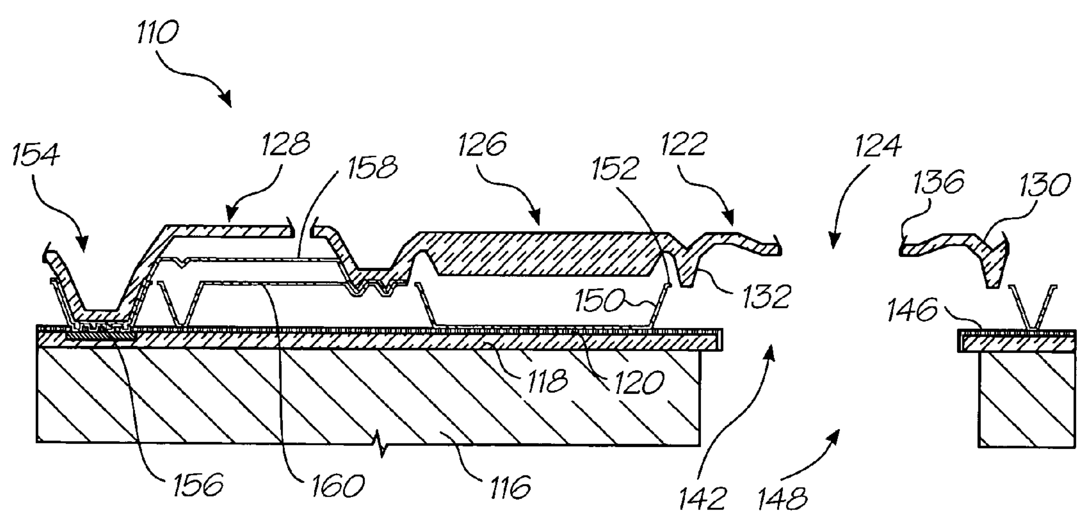
Figure 27A:
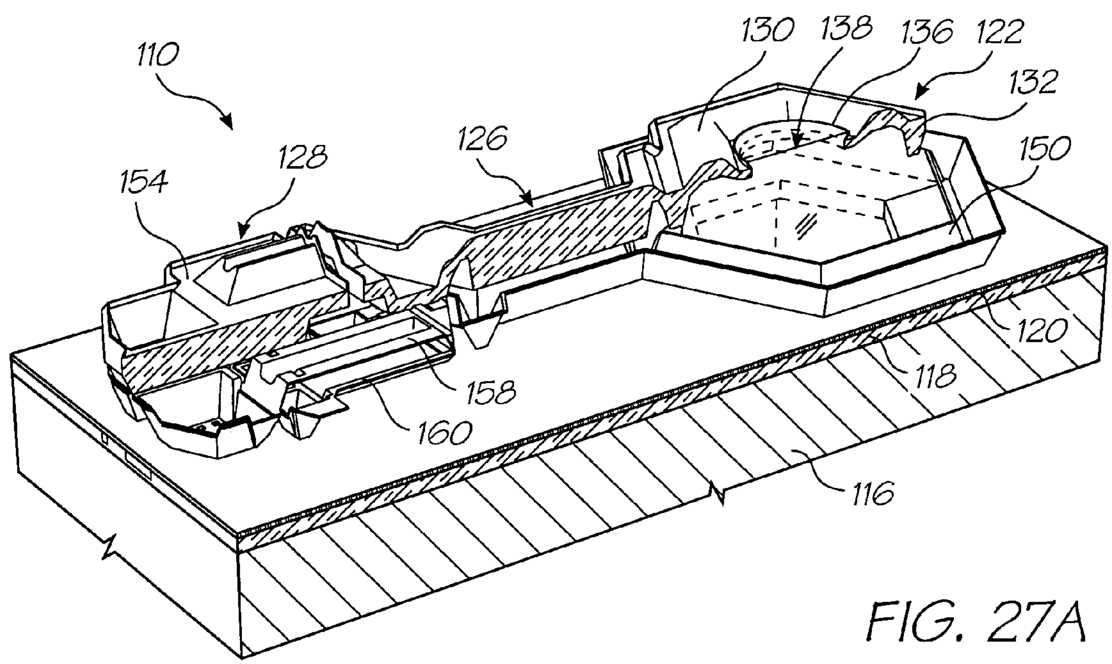
Figure 28A:
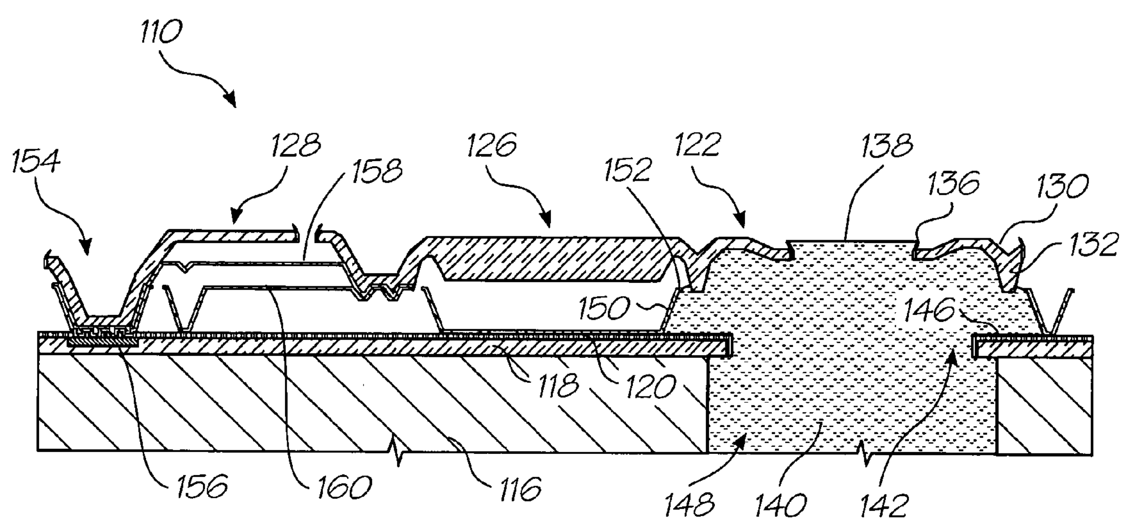
Figure 27B:
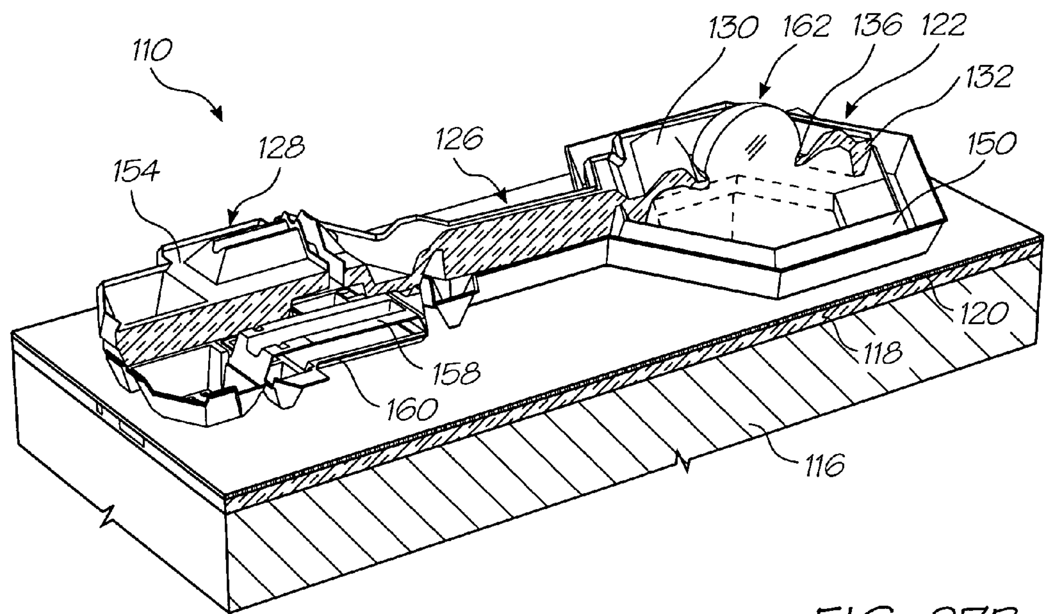
Figure 28B:
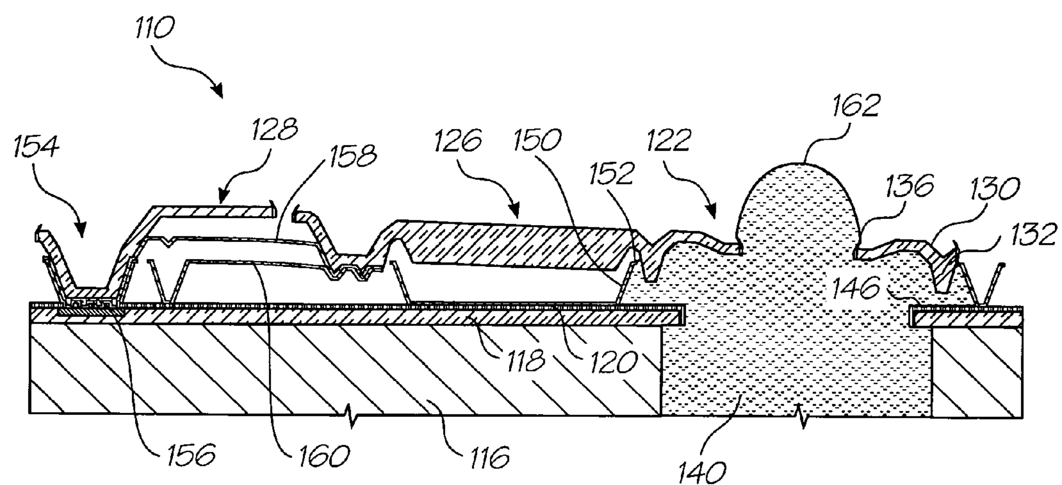
Figure 27C:
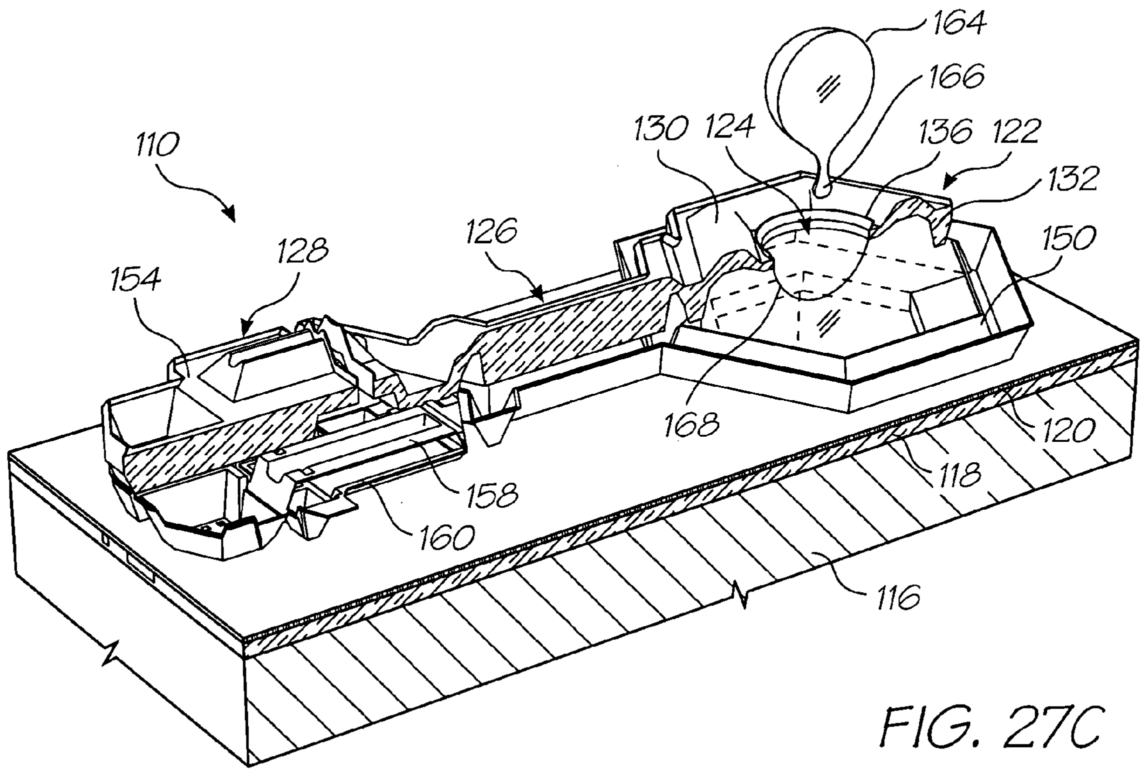
Figure 28C:
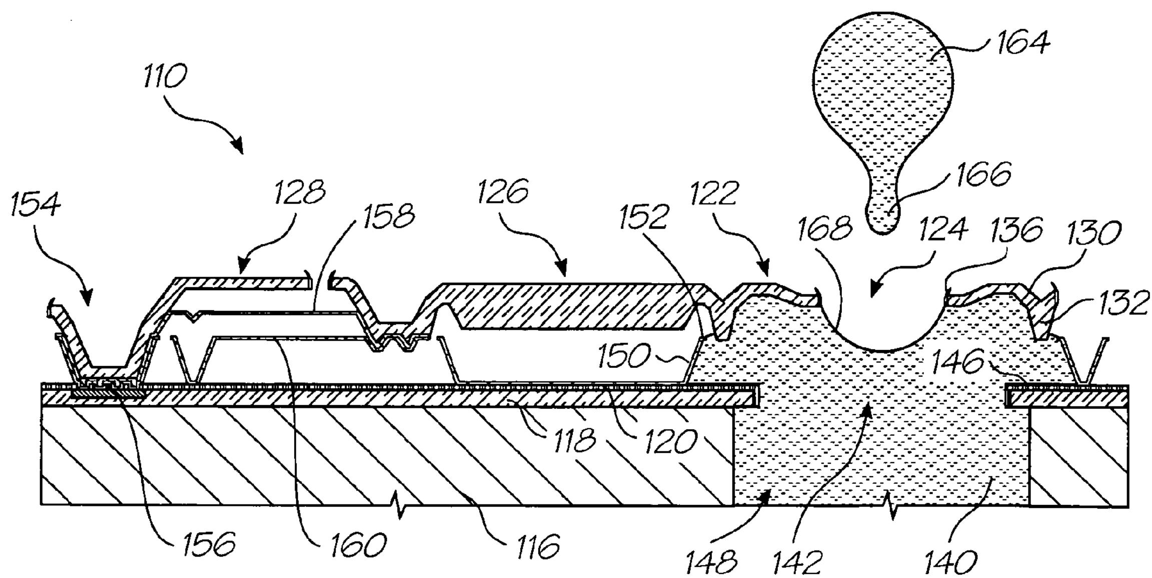

A further UV release tape (not shown) is applied to a rear of the wafer 16 and the tape 240 is removed. The sacrificial layers 208, 212, 220, 228 and 234 are stripped in oxygen plasma to provide the final nozzle assembly 110 as shown in FIGS. 24*r* and 25*r* of the drawings. For ease of reference, the reference numerals illustrated in these two drawings are the same as those in FIG. 17 of the drawings to indicate the relevant parts of the nozzle assembly 110. FIGS. 27 and 28 show the operation of the nozzle assembly 110, manufactured in accordance with the process described above with reference to FIGS. 24 and 25, and these figures correspond to FIG. 18 to 20 of the drawings.

It will be understood by those skilled in the art that many other forms of construction may be possible utilizing a wide range of materials having suitable characteristics without departing from the spirit or scope of the invention as broadly described. The present embodiment is, therefore, to be considered in all respects to be illustrative and not restrictive.

The presently disclosed ink jet printing technology is potentially suited to a wide range of printing systems including: color and monochrome office printers, short run digital printers, high speed digital printers, offset press supplemental printers, low cost scanning printers, high speed pagewidth printers, notebook computers with inbuilt pagewidth printers, portable color and monochrome printers, color and monochrome copiers, color and monochrome facsimile machines, combined printer, facsimile and copying machines, label printers, large format plotters, photograph copiers, printers for digital photographic 'minilabs', video printers, PHOTO CD (PHOTO CD is a registered trade mark of the Eastman Kodak Company) printers, portable printers for PDAs, wallpaper printers, indoor sign printers, billboard printers, fabric printers, camera printers and fault tolerant commercial printer arrays.

We claim:

1. An inkjet printhead comprising a plurality of nozzle assemblies, each nozzle assembly comprising:

a nozzle chamber for ink to be ejected, the chamber comprising an ink inlet for fluid communication with an ink reservoir and a nozzle through which ink from the chamber can be ejected;

at least one thermal actuator for contracting the chamber such that ink is ejected through the nozzle; and wherein the chamber has four side walls, each of the side walls connected to a respective thermal actuator.

2. An inkjet printhead according to claim 1 wherein the chamber has an inlet wall defining the ink inlet, a nozzle wall spaced from the inlet wall, the nozzle wall defining the nozzle, and side walls between the inlet wall and the nozzle wall; and the at least one thermal actuator moves at least one of the side walls to contract the chamber.

3. An inkjet printhead according to claim 1 wherein the four side walls are inmate vane arranged around a central axis, and the thermal actuators are expanding, flexible arms such that simultaneous actuation of the arms pushes the arcuate vanes to slidingly engage each other to contract the chamber.

4. An inkjet printhead according to claim 3 wherein said flexible expanding arms comprise a conductive heater material encased within an expansion material having a high coefficient of thermal expansion.

5. An inkjet printhead according to claim 4 wherein said conductive heater material is constructed so as to farm a concertina upon expansion of said expansion material.

6. An inkjet printhead according to claim 4 wherein said beater material is of a serpentine form and forms a concertina upon heating so as to allow substantially unhindered expansion of said expansion material during heating.

7. An inkjet printhead according to claim 4 wherein said vanes are arranged annularly around said nozzle.

8. An inkjet printhead according to claim 4 wherein said vanes operate as an iris round said nozzle.

9. An inkjet printhead according to claim 4 wherein said expansion material comprises substantially polytetrafluoroethylene.

10. An inkjet printhead according to claim 4 wherein said conductive beater material comprises substantially copper.

* * * * *